US009842857B2

(12) United States Patent
Sharangpani et al.

(10) Patent No.: US 9,842,857 B2
(45) Date of Patent: Dec. 12, 2017

(54) DIFFERENTIAL ETCH OF METAL OXIDE BLOCKING DIELECTRIC LAYER FOR THREE-DIMENSIONAL MEMORY DEVICES

(71) Applicant: SANDISK TECHNOLOGIES LLC, Plano, TX (US)

(72) Inventors: Rahul Sharangpani, Fremont, CA (US); Sateesh Koka, Milpitas, CA (US); Raghuveer S. Makala, Campbell, CA (US); Srikanth Ranganathan, Fremont, CA (US); Mark Juanitas, Newark, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/440,365

(22) Filed: Feb. 23, 2017

(65) Prior Publication Data
US 2017/0162597 A1 Jun. 8, 2017

Related U.S. Application Data

(62) Division of application No. 14/748,871, filed on Jun. 24, 2015, now Pat. No. 9,613,977.

(51) Int. Cl.
*H01L 29/76* (2006.01)
*H01L 27/11582* (2017.01)
(Continued)

(52) U.S. Cl.
CPC ...... *H01L 27/11582* (2013.01); *H01L 23/528* (2013.01); *H01L 23/5226* (2013.01);
(Continued)

(58) Field of Classification Search
CPC ......... H01L 27/11582; H01L 27/11524; H01L 27/11529; H01L 27/11556; H01L 27/1157;
(Continued)

(56) References Cited

U.S. PATENT DOCUMENTS

| 5,915,167 A | 6/1999 | Leedy |
|---|---|---|
| 7,177,191 B2 | 2/2007 | Fasoli et al. |

(Continued)

FOREIGN PATENT DOCUMENTS

| WO | WO02/15277 A2 | 2/2002 |
|---|---|---|
| WO | WO2012/003301 A2 | 1/2012 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Yosef Gebreyesus
(74) *Attorney, Agent, or Firm* — The Marbury Law Group PLLC

(57) ABSTRACT

A method of manufacturing a semiconductor structure includes forming a stack of alternating layers comprising insulating layers and spacer material layers over a semiconductor substrate, forming a memory opening through the stack, forming an aluminum oxide layer having a horizontal portion at a bottom of the memory opening and a vertical portion at least over a sidewall of the memory opening, where the horizontal portion differs from the vertical portion by at least one of structure or composition, and selectively etching the horizontal portion selective to the vertical portion.

6 Claims, 24 Drawing Sheets

(51) Int. Cl.
  *H01L 27/1157*    (2017.01)
  *H01L 27/11573*   (2017.01)
  *H01L 27/11524*   (2017.01)
  *H01L 27/11556*   (2017.01)
  *H01L 27/11529*   (2017.01)
  *H01L 23/522*     (2006.01)
  *H01L 23/528*     (2006.01)

(52) U.S. Cl.
  CPC .... *H01L 27/1157* (2013.01); *H01L 27/11524* (2013.01); *H01L 27/11529* (2013.01); *H01L 27/11556* (2013.01); *H01L 27/11573* (2013.01)

(58) Field of Classification Search
  CPC .......... H01L 27/11573; H01L 23/5226; H01L 23/528
  See application file for complete search history.

(56) References Cited

U.S. PATENT DOCUMENTS

| | | | |
|---|---|---|---|
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,309,405 | B2 | 11/2012 | Yang et al. |
| 8,349,681 | B2 | 1/2013 | Alsmeier et al. |
| 8,614,126 | B1 | 12/2013 | Lee et al. |
| 8,658,499 | B2 | 2/2014 | Makala et al. |
| 8,946,023 | B2 | 2/2015 | Makala et al. |
| 9,023,719 | B2 | 5/2015 | Pachamuthu et al. |
| 9,230,979 | B1 | 1/2016 | Pachamuthu et al. |
| 9,236,396 | B1 | 1/2016 | Koka et al. |
| 9,305,849 | B1 | 4/2016 | Tsutsumi et al. |
| 9,305,937 | B1 | 4/2016 | Tsutsumi et al. |
| 9,379,132 | B2 | 6/2016 | Koka et al. |
| 9,478,558 | B2 | 10/2016 | Koka et al. |
| 9,570,460 | B2 | 2/2017 | Kanakamedala et al. |
| 2007/0210338 | A1 | 9/2007 | Orlowski |
| 2007/0252201 | A1 | 11/2007 | Kito et al. |
| 2009/0283819 | A1 | 11/2009 | Ishikawa et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2011/0291178 | A1 | 12/2011 | Sasaki et al. |
| 2012/0001247 | A1 | 1/2012 | Alsmeier |
| 2012/0001249 | A1 | 1/2012 | Alsmeier |
| 2012/0049268 | A1 | 3/2012 | Chang et al. |
| 2012/0083077 | A1 | 4/2012 | Yang et al. |
| 2012/0086072 | A1 | 4/2012 | Yun et al. |
| 2012/0112264 | A1 | 5/2012 | Lee et al. |
| 2012/0146127 | A1 | 6/2012 | Lee et al. |
| 2012/0156848 | A1 | 6/2012 | Yang et al. |
| 2012/0256247 | A1 | 10/2012 | Alsmeier |
| 2013/0134492 | A1 | 5/2013 | Yang et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0084357 | A1 | 3/2014 | Choi et al. |
| 2014/0151774 | A1 | 6/2014 | Rhie |
| 2014/0225181 | A1 | 8/2014 | Makala et al. |
| 2014/0295636 | A1 | 10/2014 | Makala et al. |
| 2015/0076580 | A1 | 3/2015 | Pachamuthu et al. |
| 2015/0076584 | A1 | 3/2015 | Pachamuthu et al. |
| 2015/0102346 | A1 | 4/2015 | Shin et al. |
| 2015/0179660 | A1 | 6/2015 | Yada et al. |
| 2015/0318297 | A1* | 11/2015 | Hada ................ H01L 27/11582 438/269 |
| 2016/0379989 | A1 | 12/2016 | Sharangpani et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, Masahide "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to Pay Additional Fees, including Annex to Form PCT/ISA/206 Communication Relating to The Results of the Partial International Search for PCT/US2014/048160, dated Oct. 31, 2014.

International Search Report & Written Opinion received in connection with international application PCT/US2014/032123, dated Sep. 22, 2014.

Kim, S. K. et al., "Low Temperature (<100C.) Deposition of Aluminum Oxide Thin Films by ALD with $O_3$ as Oxidant," Journal of the Electrochemical Society, vol. 153, No. 5, pp. F69-F76, (2006).

Pong, R. et al., "A Displacement Reaction Source Demonstrated for Aluminum Implantation and Proposed for Indium Implantation," IEEE Ion Implantation Technology Proceedings, 1998 International Conference, vol. 1, pp. 388-391, (1998).

Grampeix, H. et al., "Effect of Nitridation for High-K Layers by ALCVD™ in Order to Decrease the Trapping in Non Volatile Memories," ECS Transactions, vol. 11, No. 7, pp. 213-225, (2007).

Frank, M. M. et al., "Enhanced Initial Growth of Atomic-Layer-Deposited Metal Oxides on Hydrogen-Terminated Silicon," Applied Physics Letters, vol. 83, No. 4, pp. 740-739, (2003).

International Search Report and Written Opinion, International Application No. PCT/US2016/031331, dated Aug. 23, 2016, 12pgs.

* cited by examiner

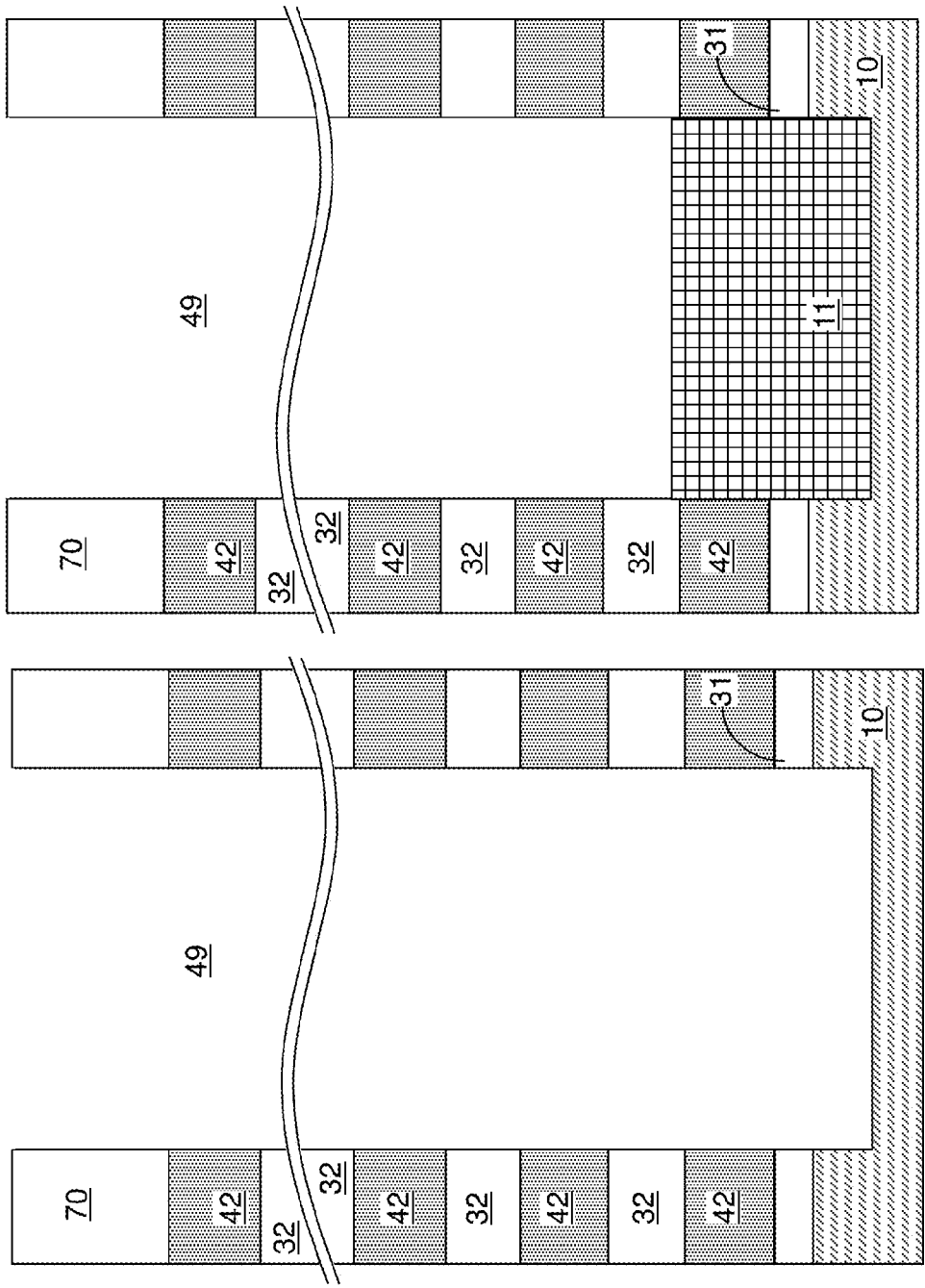

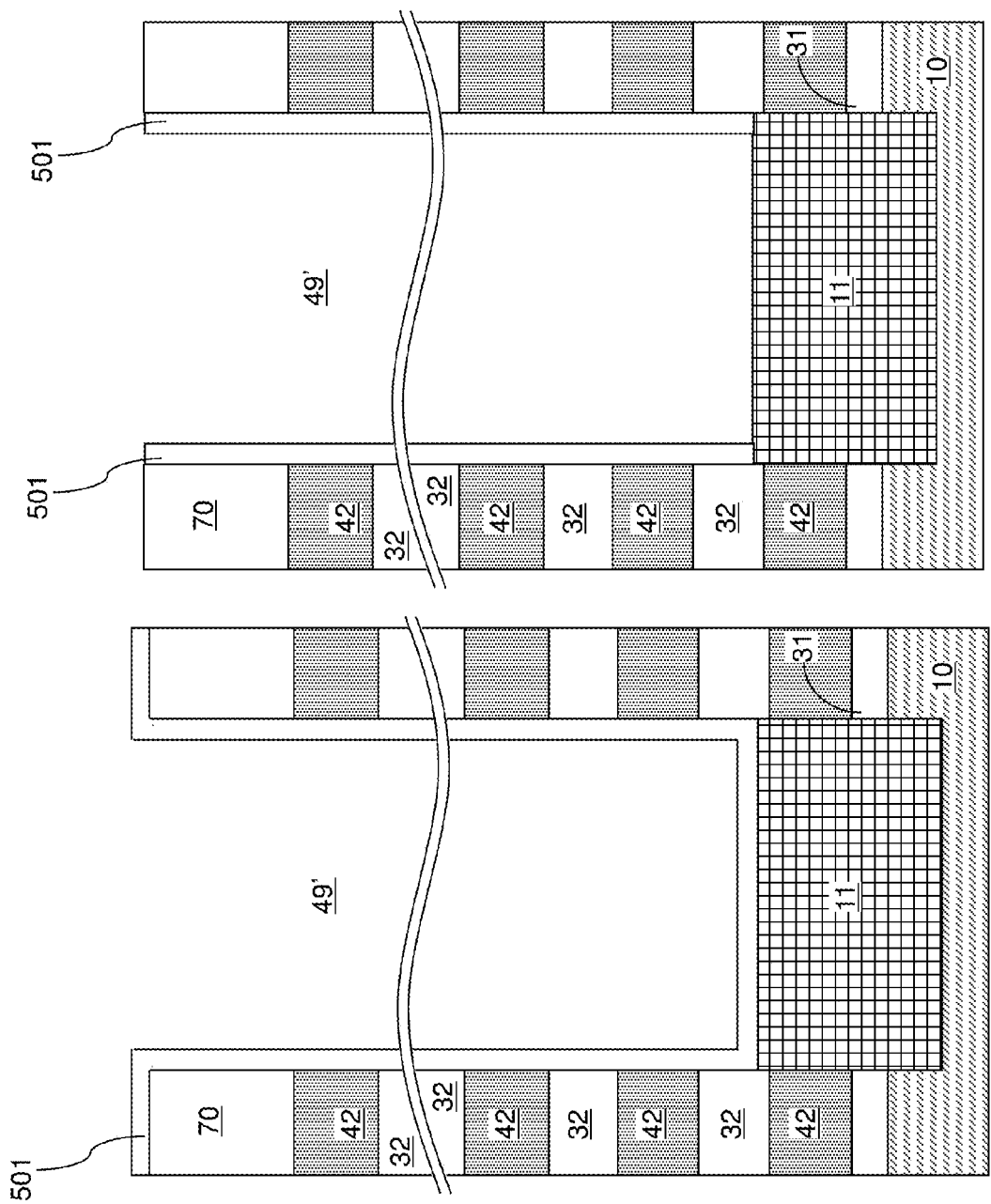

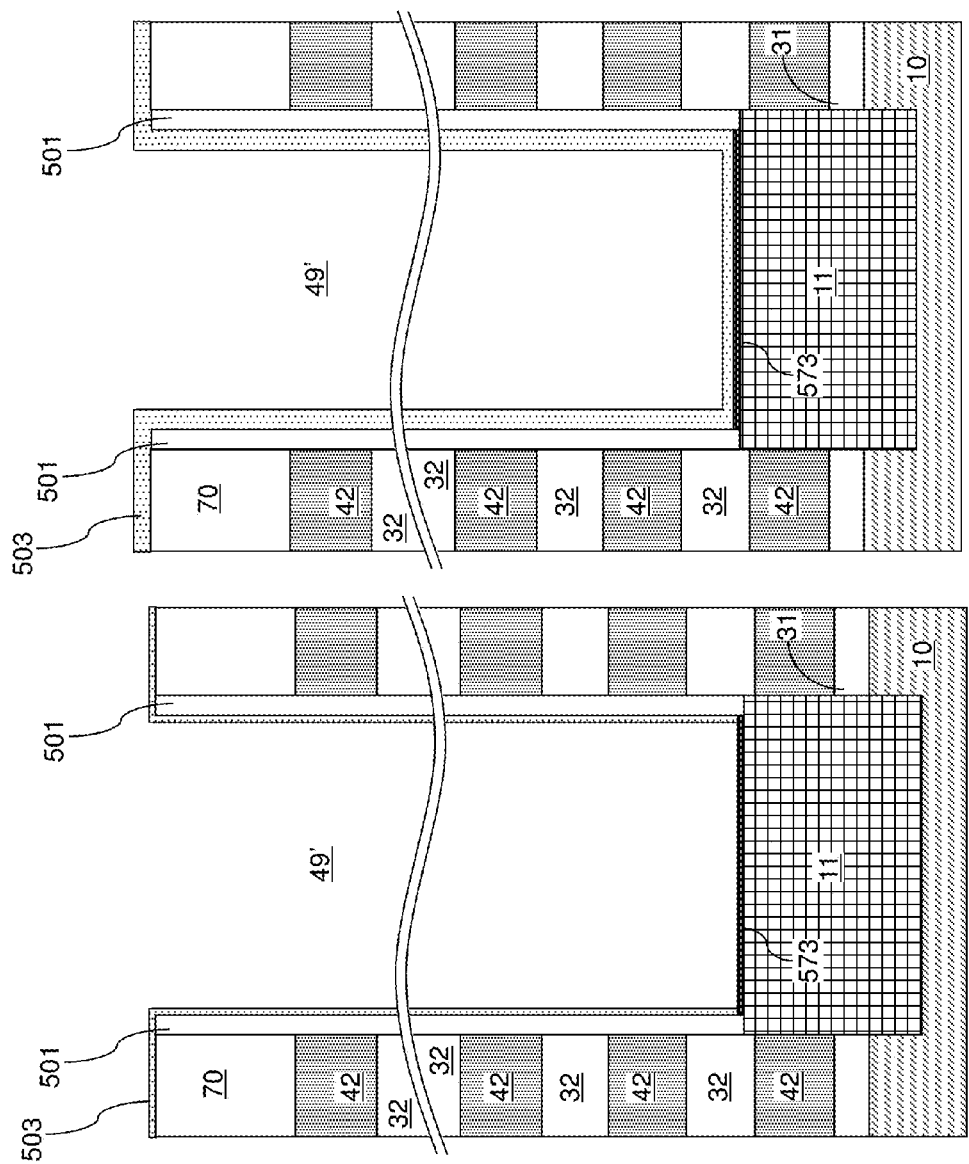

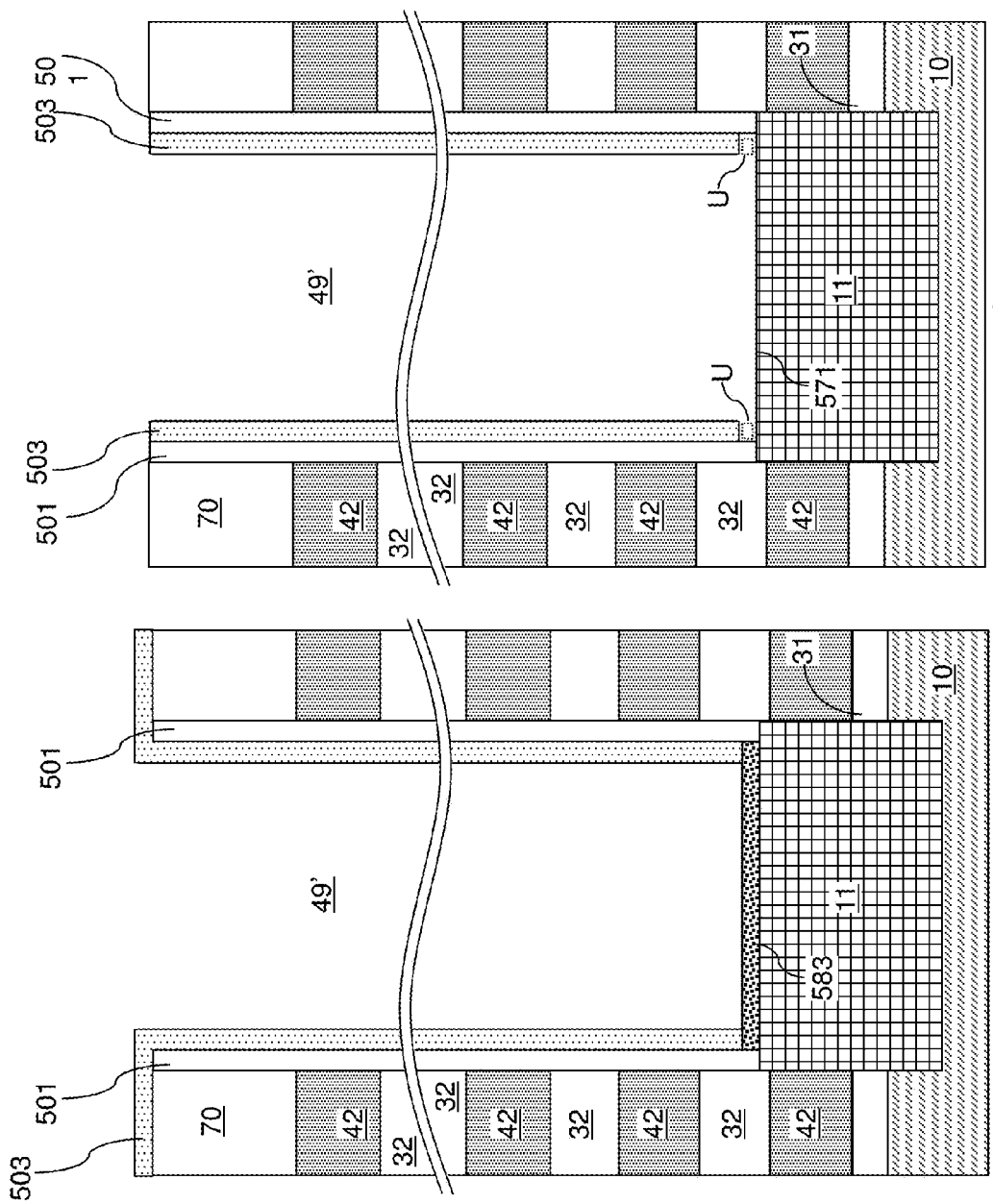

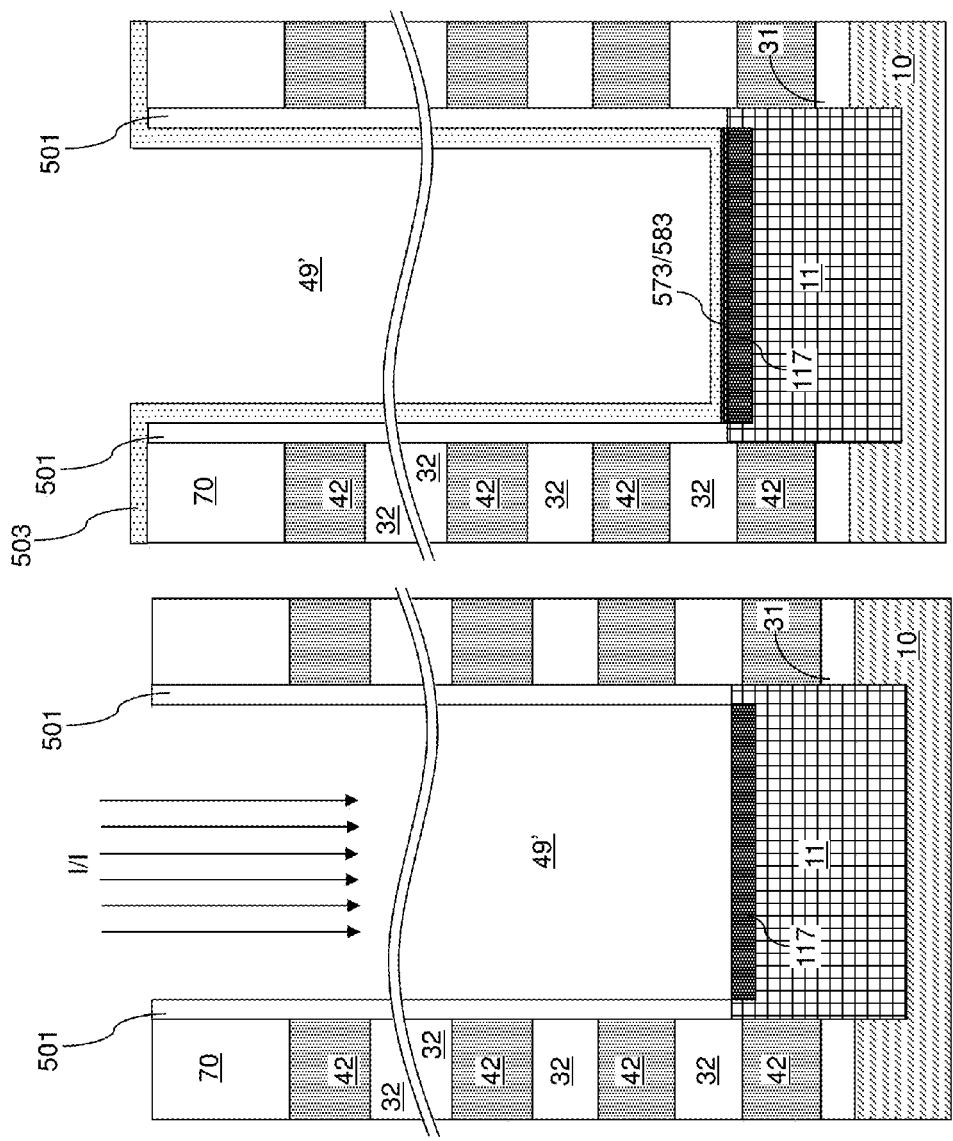

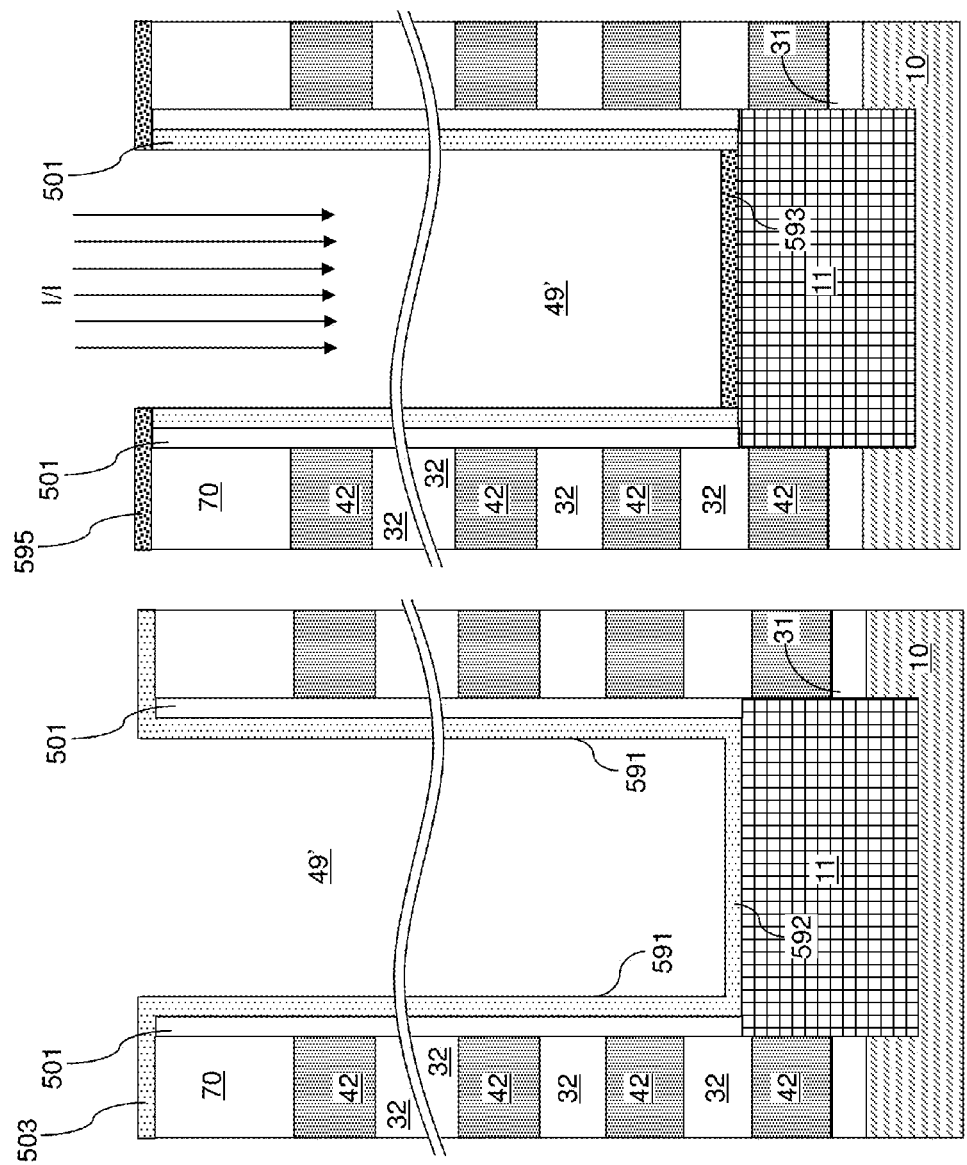

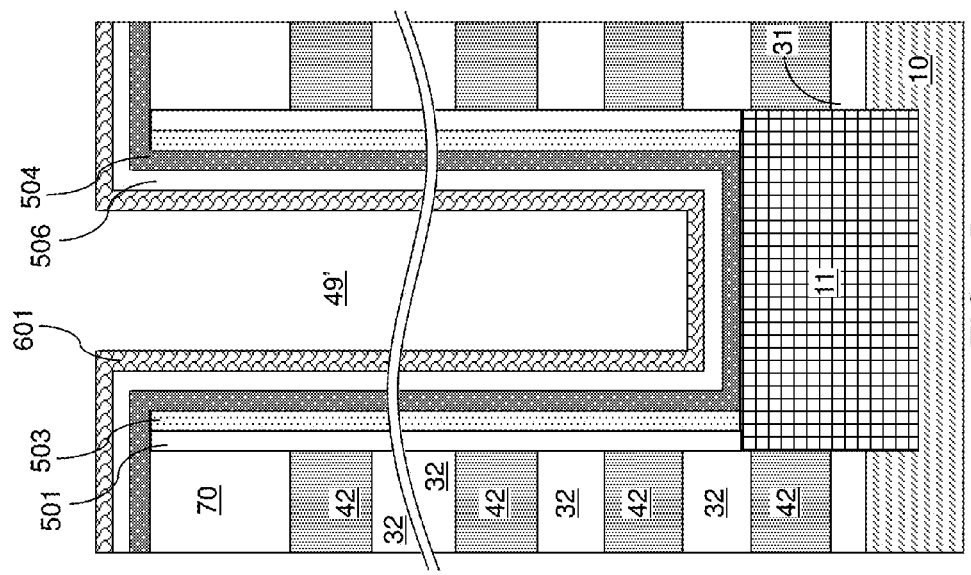
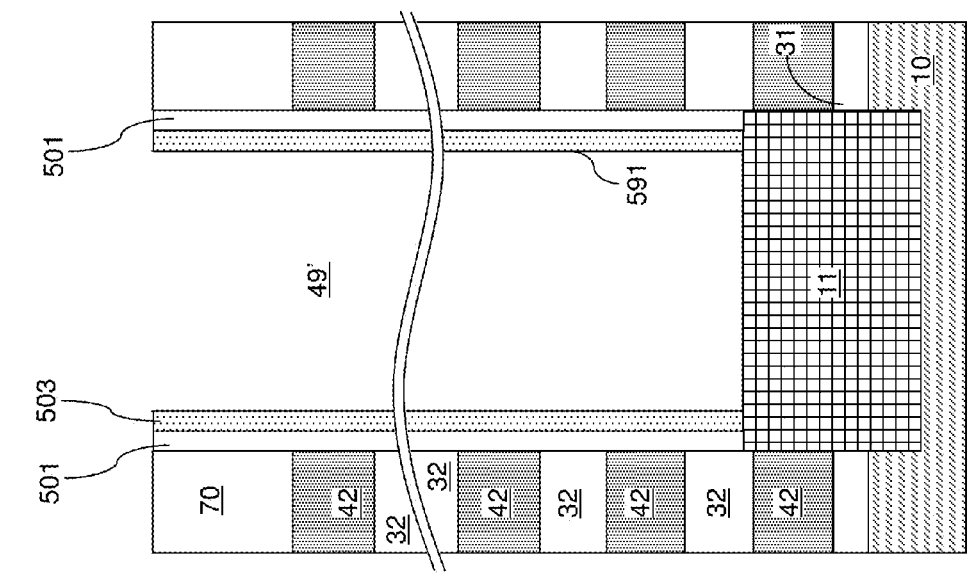

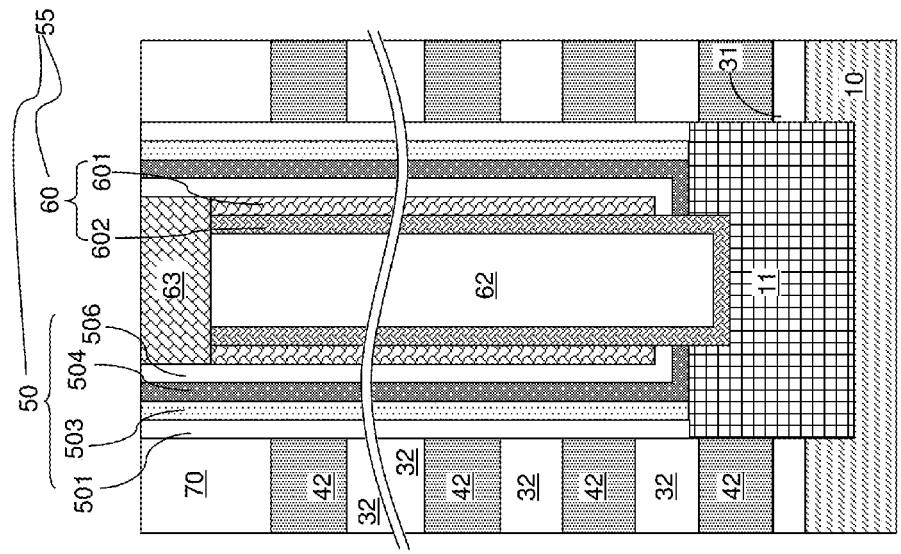
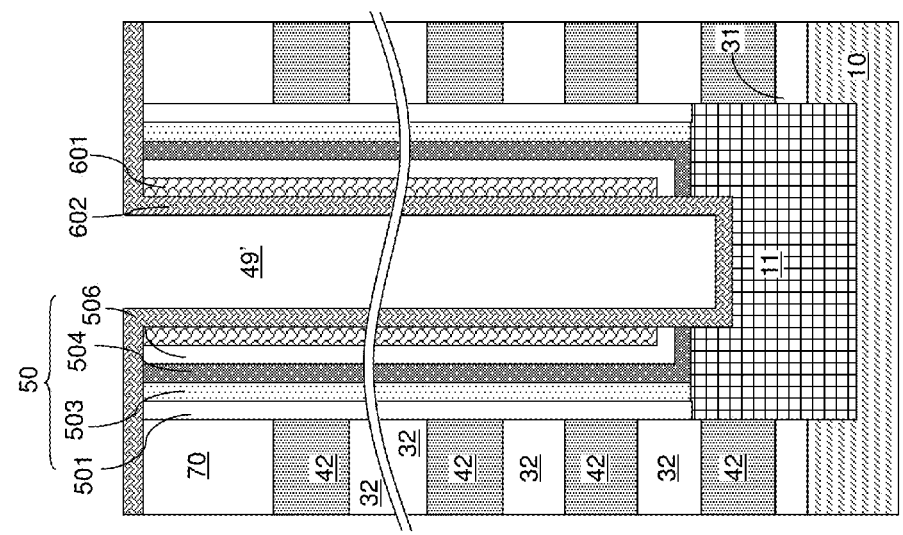

DIFFERENTIAL ETCH OF METAL OXIDE BLOCKING DIELECTRIC LAYER FOR THREE-DIMENSIONAL MEMORY DEVICES

FIELD

The present disclosure relates generally to the field of semiconductor devices and specifically to three-dimensional semiconductor devices, such as vertical NAND strings, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

A dielectric metal oxide material can be employed for a blocking dielectric layer that provides electrical isolation between control gate electrodes and memory elements configured to store electrical charges. In case the dielectric metal oxide blocking dielectric layer is formed inside a memory opening, a bottom portion of the dielectric metal oxide blocking dielectric layer needs to be removed by an anisotropic etch to physically expose a semiconductor surface of the substrate prior to forming a vertical semiconductor channel. However, anisotropic etch of the dielectric metal oxide material of the blocking dielectric layer poses a challenge due to low selectivity of the etch process and relative high collateral etch rate of the vertical portions of the blocking dielectric layer.

SUMMARY

According to an aspect of the present disclosure, a method of manufacturing a semiconductor structure includes forming a stack of alternating layers comprising insulating layers and spacer material layers over a semiconductor substrate, forming a memory opening through the stack, forming an aluminum oxide layer having a horizontal portion at a bottom of the memory opening and a vertical portion at least over a sidewall of the memory opening, where the horizontal portion differs from the vertical portion by at least one of structure or composition, and selectively etching the horizontal portion selective to the vertical portion.

According to another aspect of the present disclosure, a monolithic three-dimensional device structure is provided, which comprises a stack of alternating layers comprising insulator layers and electrically conductive layers and located over a semiconductor substrate; a memory stack structure extending through the stack of alternating layers, the memory stack structure comprising a blocking dielectric layer, a memory material layer, and a tunneling dielectric layer; and a semiconductor channel located within the memory stack structure. The blocking dielectric layer comprises at least an aluminum oxide layer laterally surrounding, and contacting, the memory material layer. A bottom surface of the aluminum oxide layer is vertically spaced from a bottom surface of the memory material layer by a horizontal portion of the memory material layer.

BRIEF DESCRIPTION OF THE DRAWINGS

FIGS. 2A-2L are sequential vertical cross-sectional views of a memory opening within the exemplary structure during various processing steps employed to form a first exemplary memory stack structure according to an embodiment of the present disclosure.

FIGS. 2M-2O are sequential vertical cross-sectional views of a memory opening within the exemplary structure during various processing steps employed to form a variation of the first exemplary memory stack structure according to an embodiment of the present disclosure.

FIGS. 3A-3F are sequential vertical cross-sectional views of a memory opening within the exemplary structure during various processing steps employed to form a second exemplary memory stack structure according to an embodiment of the present disclosure.

DETAILED DESCRIPTION

Figure 1:
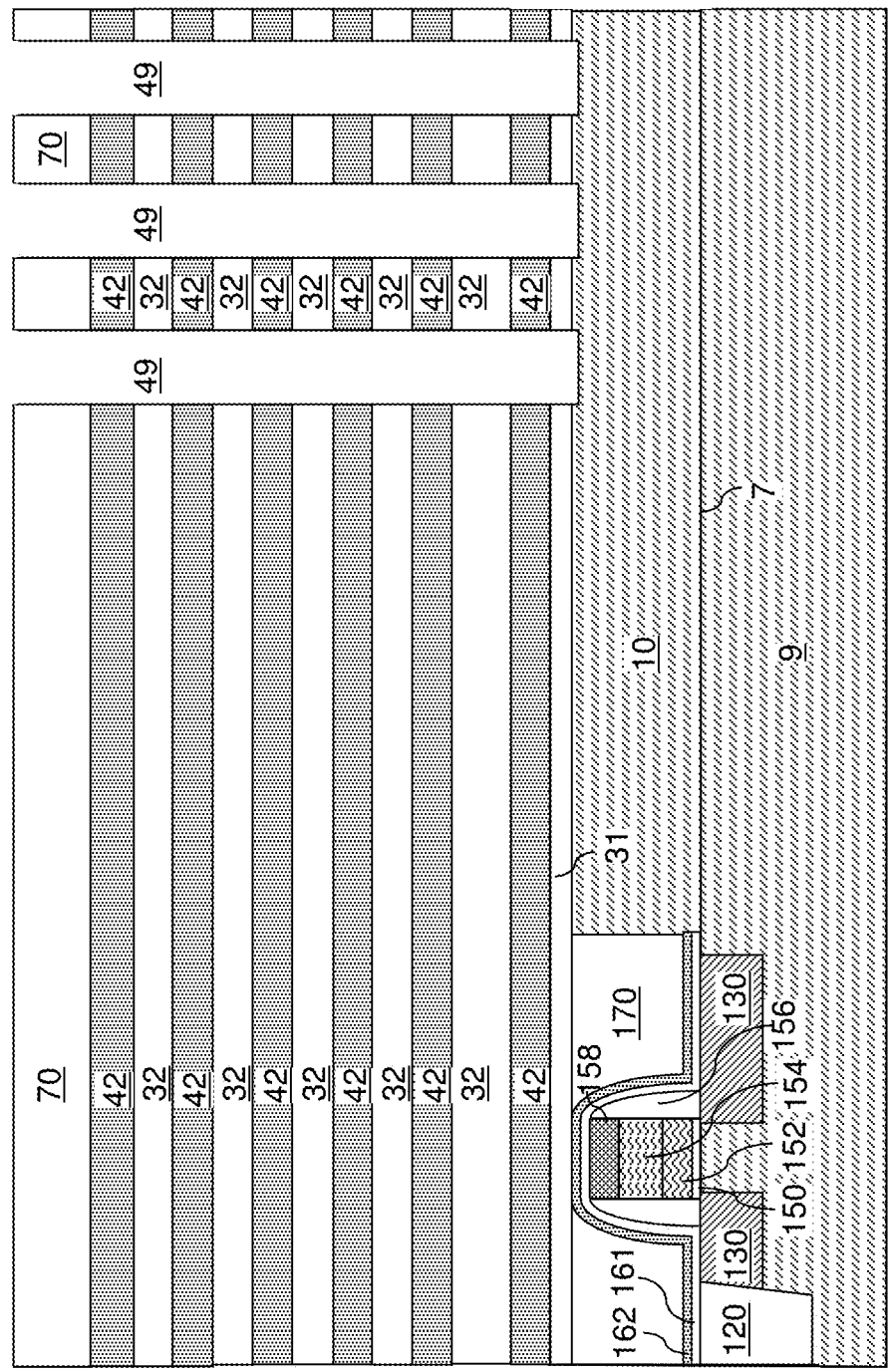
FIG. 1 is a vertical cross-sectional view of an exemplary structure after formation of a stack including an alternating plurality of material layers and memory openings extending through the stack according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A planar dielectric layer 31 can be formed above the semiconductor material layer 10. The planar dielectric layer 31 can be a gate dielectric layer that vertically separates horizontal portions of semiconductor channels in an upper portion of the semiconductor material layer 10 and select gate electrodes to be subsequently formed by replacing a bottommost sacrificial material layer 42. The planar dielectric layer 31 can be, for example, a silicon oxide layer, a dielectric metal oxide layer, or a combination thereof. The thickness of the planar dielectric layer 31 can be in a range from 1 nm to 10 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the planar dielectric layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer that provides vertical separation between a vertically neighboring pair of insulator layers 32.

In one embodiment, the spacer material layers can be permanent layers that are not subsequently replaced with a different material. In this case, the spacer material layers can include a conductive material such as doped semiconductor material (such as doped polysilicon or a doped silicon-containing alloy). Alternatively, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the planar dielectric layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the planar dielectric layer 31 so that the memory openings 49 extend from the top surface of the alternating stack (32, 42) to the top surface of the semiconductor material layer 10 within the substrate between the lower select gate electrodes. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2L illustrate sequential vertical cross-sectional views of a memory opening within the exemplary structure during formation of a first exemplary memory stack structure according to a embodiment of the present disclosure. Formation of the exemplary memory stack structure can be performed within each of the memory openings 49 in the exemplary structure illustrated in FIG. 1.

Referring to FIG. 2A, a memory opening 49 in the exemplary structure of FIG. 1 is illustrated in a magnified view. The memory opening 49 extends through the insulating cap layer 70, the alternating stack (32, 42), the planar dielectric layer 31, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, an optional outer blocking dielectric layer 501 can be deposited by a conformal deposition method. If employed, the outer blocking dielectric layer 501 is employed as a sub-layer of a blocking dielectric layer. As used herein, a "sub-layer" refers to a layer that is a component layer of another structure that constitutes a layer. In one embodiment, the outer blocking dielectric layer 501 can include silicon oxide, silicon oxynitride, silicon nitride, a dielectric metal oxide other than aluminum oxide (such as hafnium oxide, lanthanum oxide, or zirconium oxide), or a combination thereof. In one embodiment, the outer blocking dielectric layer 501 can include silicon oxide (e.g., $SiO_2$). The outer blocking dielectric layer 501 can be formed by a conformal deposition method such as low pressure chemical vapor deposition, atomic layer deposition, or a combination thereof. The thickness of the outer blocking dielectric layer 501 can be in a range from 1 nm to 20 nm (such as from 2 nm to 4 nm), although lesser and greater thicknesses can also be employed. Alternatively, the outer blocking dielectric layer 501 can be omitted, and a backside blocking dielectric layer can be formed after formation of backside recesses. A cavity 49' is present in the volume of the memory opening that is not filled with the epitaxial channel portion 11 or the outer blocking dielectric layer 501.

Referring to FIG. 2D, the outer blocking dielectric layer 501 is anisotropically etched, for example, by a reactive ion etch process, to remove horizontal portions. The top surface of the epitaxial channel portion 11 is physically exposed at the bottom of the cavity 49'. If the epitaxial channel portion 11 is omitted then the top portion of layer 10 is exposed. The remaining vertical portions of the outer blocking dielectric layer 501 within the memory opening 49 constitute an outer blocking dielectric spacer, which can be homeomorphic to a torus. As used herein, an element is homeomorphic to a torus if the shape of the element can be continuously transformed into a shape of a torus without creating a new hole or without destroying an existing hole. The outer blocking dielectric layer 501 as an outer spacer is formed directly on the sidewall surface of the memory opening 49. In one embodiment, the outer blocking dielectric layer 501 can comprise a silicon oxide spacer.

Referring to FIG. 2E, an atomic layer deposition process is performed to deposit aluminum oxide or an aluminum-carbon-oxygen alloy depending on surface conditions. The aluminum oxide may be stoichiometric (e.g., $Al_2O_3$) or non-stoichiometric (e.g., having an Al:O atomic ratio of greater than or less than 2:3, such as 1.5:3 to 2.5:3). The atomic layer deposition process employs an organic (i.e., carbon containing) precursor gas including at least one aluminum atom and an oxidizer gas. The organic precursor gas and the oxidizer gas are alternately flowed into a process chamber including the semiconductor substrate (9, 10) during the atomic layer deposition process.

The combination of the organic precursor gas and the oxidizer gas can be selected such that aluminum oxide is deposited on dielectric surfaces such as the inner sidewall of the outer blocking dielectric layer 501 (which is a dielectric spacer), while an aluminum-carbon-oxygen alloy material is deposited on physically exposed semiconductor surfaces such as the top surface of the epitaxial channel portion 11 (or top surface of layer 10 if the epitaxial channel portion 11 is omitted). The aluminum-carbon-oxygen alloy portion 573 can be deposited on the bottom surface of memory opening concurrently with deposition of a vertical portion of the aluminum oxide layer 503 over the sidewalls of the memory opening 49.

The aluminum-carbon-oxygen alloy portion 573 and the aluminum oxide layer 503 are formed simultaneously by atomic layer deposition process employing the same precursor gas and the same oxidizer gas. Incorporation of carbon into the aluminum-carbon-oxygen alloy portion 573 is a phenomenon that is dependent on the surface condition of the top surface of the epitaxial channel portion 11 and on the selection of the precursor gas and the oxidizer gas. In other words, selection of the precursor gas and the oxidizer gas affects the carbon content in the aluminum-carbon-oxygen alloy portion 573. Thus, the total amount of carbon that can be deposited on the top surface of the epitaxial channel portion can be maximized by selecting an optimal combination of the precursor gas and the oxidizer gas. Generally, a higher carbon concentration and a greater thickness is preferred for aluminum-carbon-oxygen alloy portion 573 so as to maximize the carbon content that is deposited over the top surface of the epitaxial channel portion.

Generally, an organic precursor gas including at least one aluminum atom within the molecule can be employed to induce deposition of the aluminum-carbon-oxygen alloy portion 573 with variable carbon content within the aluminum-carbon-oxygen alloy portion 573. Of aluminum-containing organic precursors, trimethylaluminum ($Al_2(CH_3)_6$) may provide incorporation of a significant amount of carbon into aluminum oxide. In some embodiments, atomic carbon content above 50 atomic % can be achieved. The oxidizer gas can be, for example, oxygen, ozone or water vapor. Water vapor may provide a higher carbon content than oxygen gas as an oxidizing agent. In one embodiment, the organic precursor gas comprises trimethylaluminum, and the oxidizer gas comprises water vapor.

Incorporation of carbon can be enhanced by surface treatment of the top surface of the epitaxial channel portion 11. In one embodiment, the semiconductor substrate (9, 10) includes a silicon-containing semiconductor material (such as silicon or a silicon-germanium alloy), and the semiconductor surface (i.e., the top surface of the epitaxial channel portion 11) at the bottom of the memory opening can be a surface of the silicon-containing semiconductor material. In this case, the semiconductor surface at the bottom of the memory opening can be treated to form a hydrogen-terminated surface prior to the atomic layer deposition process. In an illustrative example, a wet etch in a dilute hydrofluoric acid or a HF vapor etch can be employed to remove the native oxide on the top surface of the epitaxial channel portion 11, and to provide a hydrogen-terminated surface at the top surface of the epitaxial channel portion 11.

The temperature of the atomic layer deposition process can be selected to maximize carbon incorporation in the aluminum-carbon-oxygen alloy portion 573. For example, if the organic precursor gas comprises trimethylaluminum and the oxidizer gas comprises water vapor, the deposition temperature can be in a range from 100 degrees Celsius to 250 degrees Celsius (for example, between 125 degrees Celsius and 150 degrees Celsius), although lower and higher temperatures can also be employed. The pulse duration for the organic precursor gas flow and the pulse duration for the oxidizer gas flow can also be optimized to increase carbon incorporation.

The thickness of the aluminum-carbon-oxygen alloy portion 573 can be self-limiting because the material of the aluminum-carbon-oxygen alloy portion 573 provides a surface that is conductive to deposition of aluminum oxide, i.e., a compound of aluminum and oxygen that is substantially free of carbon. In one embodiment, the thickness of the aluminum-carbon-oxygen alloy portion 573 can be in a range from 1 monolayer to 5 monolayers (e.g., 1-1.5 nm) depending on the selection of the organic precursor gas and the oxidizer gas. The average atomic carbon concentration of the aluminum-carbon-oxygen alloy portion 573 can be in a range from 20 to 70 at. % (such as from 40 to 60 at. %), although lesser and greater atomic concentrations can also be employed. The balance of the atomic composition can be a combination of oxygen atoms and aluminum atoms. In one embodiment, the atomic concentration of aluminum in the aluminum-carbon-oxygen alloy portion 573 can be in a range from 5 to 20 at. %, and the atomic concentration of oxygen in the aluminum-carbon-oxygen alloy portion 573 can be in a range from 10 to 50 at. %, although lesser and greater atomic concentrations can also be employed for each of aluminum and oxygen. The horizontal aluminum-carbon-oxygen alloy portion 573 has more carbon than the remainder (e.g., vertical portion) of the aluminum oxide layer 503, which may have 0 to 10 at. % carbon. In one embodiment, the horizontal aluminum-carbon-oxygen alloy portion 573 is thinner than the remainder (e.g., vertical portion) of the aluminum oxide layer 503. For example, the horizontal aluminum-carbon-oxygen alloy portion 573 is 15-30 percent thinner (e.g., 1-1.5 nm thick) than the remainder of the aluminum oxide layer 503 (e.g., 2-2.5 nm thick).

Referring to FIG. 2F, formation of the aluminum-carbon-oxygen alloy portion 573 proceeds directly on, or in the immediate vicinity of, a semiconductor surface. Optional continuation of the atomic layer deposition process forms aluminum oxide composed essentially of aluminum and oxygen only over the aluminum-carbon-oxygen alloy portion 573. Thus, a horizontal portion of the aluminum oxide layer 503 is deposited over the aluminum-carbon-oxygen alloy portion 573 as the atomic layer deposition process continues. The atomic layer deposition process can be continued until the vertical portion of the aluminum oxide layer 503 directly on the inner sidewall of the outer blocking dielectric spacer 501 reaches a target thickness, which can be in a range from 2 nm to 15 nm, although lesser and greater target thicknesses can also be employed.

Referring to 2G, an anneal process is performed at an elevated temperature to react the aluminum-carbon-oxygen alloy portion 573 and the horizontal portion of the aluminum oxide layer 503 and/or underlying silicon material (e.g., portion 11 or layer 10 if portion 11 is omitted). This anneal process crystallizes the amorphous material of the aluminum oxide layer 503 as deposited into a polycrystalline aluminum oxide material. During the anneal process that converts the vertical portions of the aluminum oxide layer 503 on the inner sidewalls of the outer blocking material layer 501, the combination of the horizontal portion of the aluminum oxide layer 503 and the aluminum-carbon-oxygen alloy portion 573 is converted into an alloy of C, Al and O. The anneal process is performed at an elevated temperature that is sufficiently high to induce diffusion of the carbon atoms in the aluminum-carbon-oxygen alloy portion 573 employing an anneal process to form the carbon-doped aluminum oxygen compound portion. As used herein, an "aluminum oxygen compound" refers to a compound that includes aluminum and oxygen. As used herein, a "doped aluminum oxygen compound" refers to a compound that includes aluminum, oxygen, and at least another element (e.g., carbon and/or silicon) that is not aluminum or oxygen. The temperature of the anneal process can be, for example, in a range from 700 degrees Celsius to 1,150 degrees Celsius (for example, from 900 degrees Celsius to 1,050 degrees Celsius, including 950 to 1000 degrees Celsius, such as an RTA process conducted for 15-60 seconds, such as 30-45 seconds in an inert ambient, such as nitrogen ambient), although lesser and greater temperatures can also be employed.

A doped aluminum oxygen compound portion 583 is formed at a bottom surface of the memory opening by interdiffusion of the materials of the aluminum-carbon-oxygen alloy portion 573 and the horizontal portion of the aluminum oxide layer 503 and/or the silicon substrate material (10 or 11). In one embodiment, a silicon oxide layer may be formed between the silicon substrate material (10 or 11) and the portion 573. Without wishing to be bound by a particular theory, some semiconductor atoms (e.g., silicon) may diffuse into the doped aluminum oxygen compound portion 583 during the anneal process from the silicon portion 11. The doped aluminum oxygen compound portion 583 can include each element in the aluminum-carbon-oxygen alloy portion 573, and thus, includes aluminum, carbon, and oxygen and optionally silicon. Due to the presence of the carbon atoms, the doped aluminum oxygen compound portion 583 is carbon doped, and thus, is a carbon-doped aluminum oxide compound portion, such as a silicon and carbon doped aluminum oxide. The thickness of the doped aluminum oxygen compound portion 583 may be substantially the same as the thickness of the stack of the aluminum-carbon-oxygen alloy portion 573 and the horizontal portion of the aluminum oxide layer 503, or may be greater (e.g., 3-15 nm, such as 4-8 nm) than the thickness of the stack aluminum-carbon-oxygen alloy portion 573 and the horizontal portion of the aluminum oxide layer 503 due to incorporation of additional materials (such as some semiconductor material (e.g., Si) from the epitaxial portion 11 and/or additional gas such as oxygen and/or nitrogen during the anneal process). In one embodiment, the doped aluminum oxygen compound portion 583 can comprise a carbon and silicon doped aluminum oxygen compound portion. The carbon, silicon, oxygen and/or aluminum content in the portion 583 may vary as a function of thickness of the portion 583. There may be more carbon than aluminum in all or some regions of the portions 583.

The vertical portion of the aluminum oxide layer 503 on the opening sidewall does not significantly change the composition, and may change from an as-deposited amorphous phase to a polycrystalline phase. Alternatively, it may be as-deposited as polycrystalline aluminum oxide. In one embodiment, the aluminum oxide layer 503 on the inner sidewall of the outer blocking dielectric spacer 501 and over the insulating cap layer 70 can consist essentially of aluminum oxide. The horizontal part of layer 503 on portion 573 may be interdiffused with portion 573 during the anneal to form the portion 583.

Referring to FIG. 2H, a silicon oxide layer (not shown) having a thickness in a range from 0.5 nm to 6 nm can be optionally deposited on the inner sidewalls of the aluminum oxide layer. If a silicon oxide layer is deposited, the silicon oxide layer directly contacts a memory material layer to be subsequently formed. A selective anisotropic etch can be performed to etch a horizontal portion of the optional silicon oxide layer and the doped aluminum oxygen compound portion 583 without significantly etching the vertical portion of the aluminum oxide layer 503 (or the vertical portion of the silicon oxide layer) on the sidewall of the outer blocking dielectric spacer 501. In one embodiment, the anisotropic etch can employ a plasma of $O_2$ or a mix of $CF_4$ and $O_2$. Alternative fluorocarbon etchant gas and/or alternative chlorofluorocarbon etchant gas and/or alternative oxygen source may be employed in the anisotropic etch. Dopant atoms, i.e., carbon atoms, in the aluminum oxygen compound portion 583 enhance the etch rate of the aluminum oxygen compound portion 583 relative to aluminum oxide. In other words, the etch rate of the aluminum oxygen compound portion 583 is greater than the etch rate of aluminum oxide in the aluminum oxide layer 503 due to the presence of the dopant atoms in the aluminum oxygen compound portion 583.

A semiconductor surface, i.e., the top surface of the epitaxial portion 11 (or layer 10 if portion 11 is omitted), is physically exposed from underneath the cavity 49' after the doped aluminum oxygen compound portion 583 is anisotropically etched. A suitable cleaning process can be optionally performed to remove any residual material from the top surface of the epitaxial channel portion 11. The remaining portion of the aluminum oxide layer 503 constitutes an inner blocking dielectric spacer, which can be topologically homeomorphic to a torus. In one embodiment, an undercut region U can be formed underneath the inner blocking dielectric spacer 503, which can consist essentially of aluminum oxide.

Figure 2J:
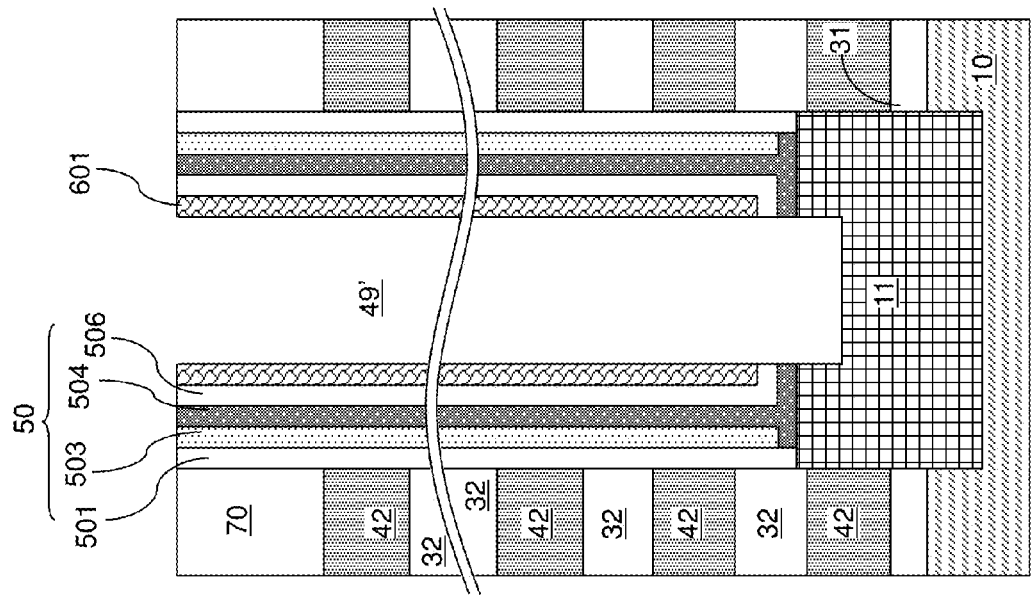
Figure 2I:
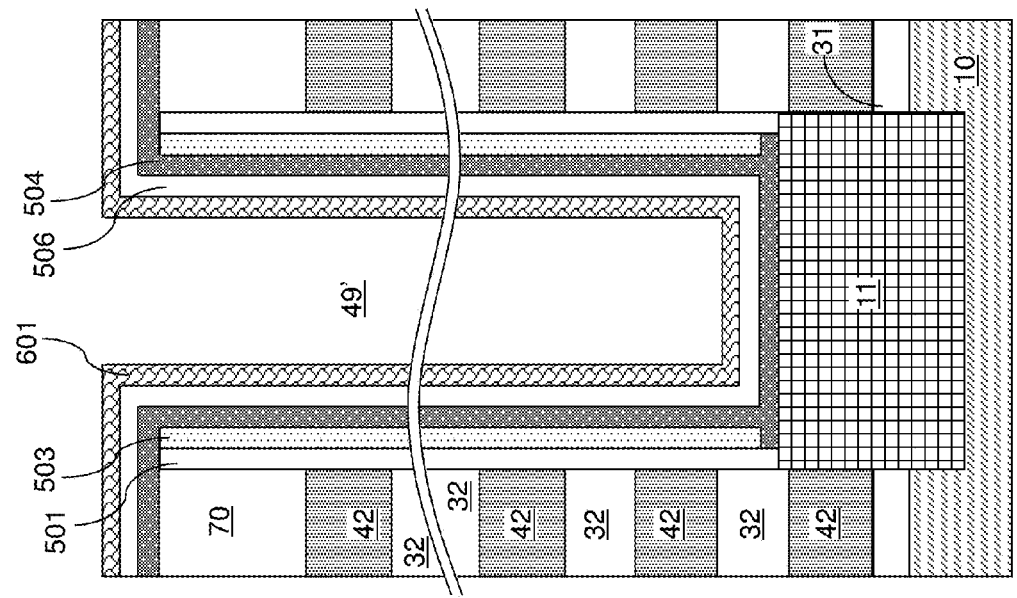

Referring to FIG. 2I, the memory material layer 504 can be formed. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

Subsequently, a tunneling dielectric layer 506 can be formed by a conformal deposition process. The tunneling dielectric layer 506 may include multiple sub-layers, or can include a homogeneous dielectric material layer. The tunneling dielectric layer 506 includes at least one dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack.

In one embodiment, the ONO stack can be formed by deposition of a silicon oxide layer, nitridation of a surface portion of the silicon oxide layer into a silicon oxynitride layer, and oxidation of a surface portion of the silicon oxynitride layer into the second silicon oxide layer. The portion of the silicon oxide layer that is not converted into the silicon oxynitride layer is the first silicon oxide layer within the ONO stack, and the portion of the silicon oxynitride layer that is not converted into the second silicon oxide layer is the silicon oxynitride layer within the ONO stack. Alternatively, the second silicon oxide layer can be formed by deposition of silicon oxide on the inner sidewalls of the silicon oxynitride layer that is formed by nitridation. In one embodiment, the tunneling dielectric layer 506 can include a silicon oxide layer that is substantially free of carbon and/or a silicon oxynitride layer that is substantially free of carbon. Optionally, at least one additional dielectric material such as a dielectric metal oxide having a dielectric constant greater than 7.9 (i.e., a high-k dielectric) may be deposited as a component of the tunneling dielectric layer 506. The thickness of the tunneling dielectric layer 506 can be in a range from 2 nm to 20 nm, although lesser and greater thicknesses can also be employed.

A first semiconductor channel layer 601 can be optionally deposited on the tunneling dielectric layer 506. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is present in the volume of each memory opening 49 that is not filled with the deposited material layers (501, 503, 504, 506, 601).

Referring to FIG. 2J, the optional first semiconductor channel layer 601, the tunneling dielectric layer 506, and the memory material layer 504 are sequentially anisotropically etched employing at least one anisotropic etch process. The portions of the first semiconductor channel layer 601, the tunneling dielectric layer 506, the memory material layer 504, and the blocking dielectric layers (501, 503) located above the top surface of the insulating cap layer 70 can be removed by the at least one anisotropic etch process. Further, the horizontal portions of the first semiconductor channel layer 601, the tunneling dielectric layer 506, and the memory material layer 504 at a bottom of each cavity 49' can be removed to form openings in remaining portions thereof. Each of the first semiconductor channel layer 601, the tunneling dielectric layer 506, and the memory material layer 504 can be etched by anisotropic etch process.

A surface of the epitaxial channel portion 11 can be physically exposed underneath the opening through the first semiconductor channel layer 601, the tunneling dielectric 506, and the charge storage element 504. Optionally, the physically exposed portion of the epitaxial channel portion 11 can be vertically recessed. A tunneling dielectric 506 is surrounded by a charge storage element 504. The charge storage element 504 can comprise a charge trapping material or a floating gate material.

The set of the tunneling dielectric 506, the charge storage element 504, the inner blocking dielectric layer 503, and the outer blocking dielectric layer 501 within each memory opening 49 collectively constitutes a memory film 50. In one embodiment, the first semiconductor channel layer 601, the tunneling dielectric 506, the charge storage element 504, the inner blocking dielectric layer 503, and the outer blocking dielectric layer 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figures 2K, 2L:
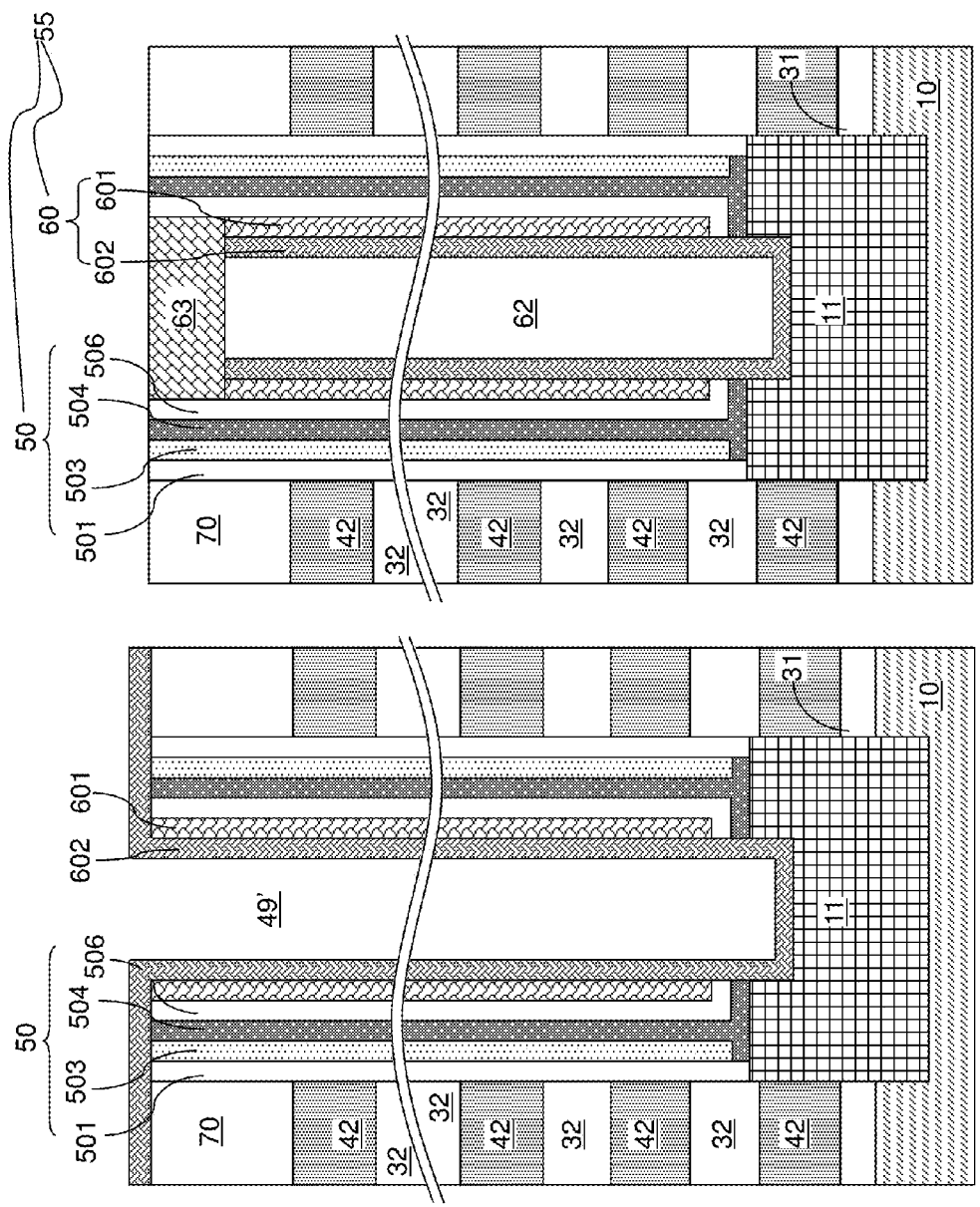
Figure 20:
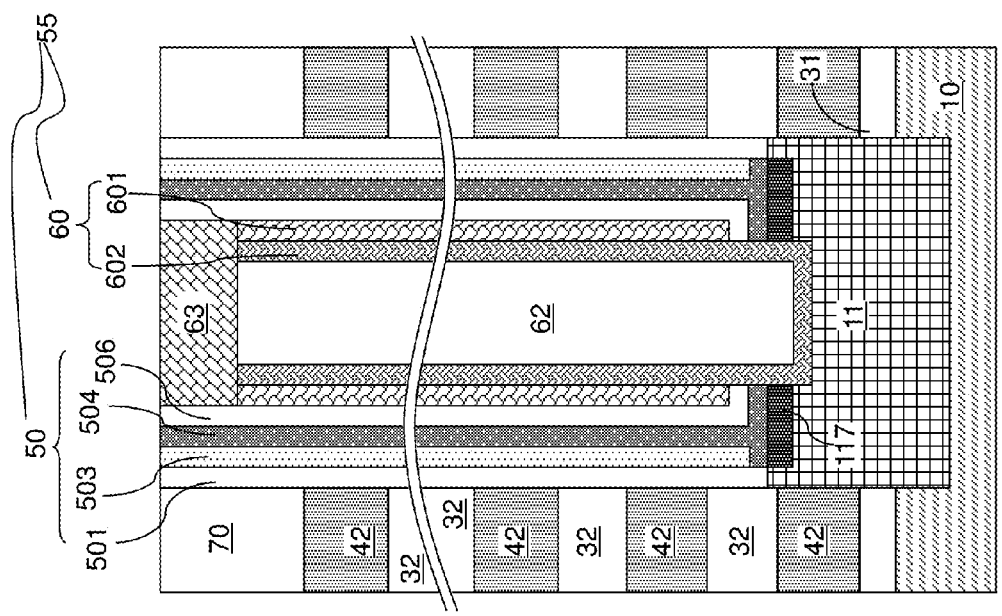

Referring to FIG. 2K, a second semiconductor channel layer 602 can be deposited directly on the semiconductor surface of the epitaxial channel portion 11 over the substrate (9, 10), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 2L, in case the cavity 49' in each memory opening is not completely filled by the second semiconductor channel layer 602, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70. Further, the horizontal portion of the second semiconductor channel layer 602 located above the top surface of the insulating cap layer 70 can be removed by a planarization process, which can employ a recess etch or chemical mechanical planarization (CMP). A vertical portion of the second semiconductor channel layer 602 remains within each memory opening 49.

Each adjoining pair of a first semiconductor channel layer 601 and a second semiconductor channel layer 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of an outer blocking dielectric layer 501, an inner blocking dielectric layer 503, a charge storage element 504, and a tunneling dielectric 506 collectively constitute a memory film 50, which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62.

Further, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

A memory stack structure 55 extending through the stack of alternating layers is formed. The memory stack structure 55 includes a memory film 50 and a semiconductor channel 60. The memory film 50 includes a blocking dielectric layer (501, 503), a memory material layer 504, and a tunneling dielectric layer 506.

Referring to FIG. 2M, the in-process structure for forming the first exemplary memory stack structure as illustrated in FIG. 2D can be modified to convert a surface portion of the semiconductor substrate (9, 10) located directly underneath a cavity 49' into a doped semiconductor portion 117. The conversion of the surface portion of the semiconductor substrate (9, 10) into the doped semiconductor portion 117 can be performed by implanting dopants into the surface portion of the semiconductor substrate 117.

In one embodiment, the dopants can be selected to facilitate formation of an aluminum-carbon-oxygen alloy portion 573 in a subsequent atomic layer deposition process. In one embodiment, the dopants can include at least one element selected from, or a compound of at least one element selected from, helium, neon, argon, krypton, hydrogen, carbon, nitrogen, oxygen, and fluorine. In one embodiment, the dopants can include carbon. In one embodiment, the dopants can be implanted by a process selected from an ion implantation process that implants the dopants at an implantation angle that is substantially parallel to the sidewall of the memory opening, and a plasma doping process.

Referring to FIG. 2N, the processing steps of FIGS. 2E and 2F can be performed. The same process parameters can be employed as described above. The presence of the dopant atoms in the doped semiconductor portion 117 can affect the amount of carbon atoms deposited in the aluminum-carbon-oxygen alloy portion 573 either positively or negatively. The selection of the dopant species and the amount of dopants implanted into the doped semiconductor portion 117 can be employed to optimize the composition and the total amount of carbon in the aluminum-carbon-oxygen alloy portion 573. In one embodiment, the selection of the dopant species and the amount of dopants implanted into the doped semiconductor portion 117 can be selected to maximize carbon incorporation into the aluminum-carbon-oxygen alloy portion 573. For example, for carbon implanted into a silicon portion 11 (or silicon layer 10), the doped semiconductor portion comprises carbon doped silicon or silicon carbide depending on the amount of carbon doping. For example, a carbon doped silicon or silicon carbide portion 117 may be annealed using rapid thermal annealing (RTA) to diffuse carbon or carbon and silicon from portion 117 into portion 573 to convert portion 573 into aluminum carbonate or silicon aluminum carbonate doped aluminum oxygen compound portion 583. The RTA may be performed at 900 to 1100° C., such as about 1000 to 1050° C. for 15 to 60 seconds, such as about 30 to 45 seconds.

Referring to FIG. 2O, the processing steps of FIGS. 2G-2L can be sequentially performed to provide a variation of the first exemplary memory stack structure. The exemplary structures illustrated in FIGS. 2L and 2O includes features that are present in the final device structure to be subsequently formed. For example, a stack of alternating layers comprising insulator layers 32 and spacer layers (as embodied as sacrificial material layers 42 that are subsequently replaced with electrically conductive layers) is located over a semiconductor substrate (9, 10). A memory stack structure 55 extending through the stack of alternating layers is formed. The memory stack structure 55 includes a memory film 50 and a semiconductor channel 60. The memory film 50 includes a blocking dielectric layer (501, 503), a memory material layer 504, and a tunneling dielectric layer 506. The blocking dielectric layer (501, 503) includes at least an aluminum oxide layer 503 laterally surrounding, and contacting, the memory material layer 504. A bottommost surface of the aluminum oxide layer 503 can is vertically spaced from a semiconductor surface (i.e., the topmost surface) of the epitaxial channel portion 11 by a horizontal portion of the memory material layer 504 that contacts the outer blocking dielectric layer 501 (i.e., the dielectric spacer). The bottommost surface of the memory material layer 504 is in contact with a top surface of an epitaxial channel portion 11 that contacts the semiconductor channel 60.

In one embodiment, the bottommost surface of the memory material layer 504 can be in contact with a doped semiconductor material portion 117 including dopants as illustrated in FIG. 2O. The dopants can include at least one element selected from helium, neon, argon, krypton, hydrogen, carbon, nitrogen, oxygen, and fluorine. In one embodiment, the doped semiconductor material portion 117 can be a carbon-doped semiconductor material portion (e.g., carbon doped silicon or silicon carbide), and the bottommost surface of the memory material layer 117 can be in contact with a carbon-doped semiconductor material portion. In one embodiment, the blocking dielectric layer (501, 503) can include a silicon oxide layer as an outer blocking dielectric layer 501, which contacts a sidewall of a memory opening in which the memory stack structure 55 is located. The memory material layer 504 can contact a portion, i.e., a lower portion, of an inner sidewall of the silicon oxide layer. In one embodiment, the aluminum oxide layer 501 can contact another portion, i.e., an upper portion, of the inner sidewall of the silicon oxide layer. In one embodiment, the bottom surface of the silicon oxide layer 501 can be coplanar with (i.e., located within the same plane as) the bottommost surface of the memory material layer 504.

Referring to FIG. 3A, an in-process structure for forming a second exemplary memory structure is illustrated, which can be derived from the in-process first exemplary memory structure of FIG. 2D by depositing an aluminum oxide layer 503 that does not provide a carbon-containing compound material on semiconductor surfaces such as the top surface of the epitaxial channel portion 11. Thus, an aluminum-carbon-oxygen alloy portion is not formed on the top surface of the epitaxial channel portion 11. Instead, the aluminum oxide layer 503 is formed directly on the top surface of the epitaxial channel portion 11. The aluminum oxide layer 503 is formed as a contiguous layer of aluminum oxide directly on the bottom surface of the cavity 49' (i.e., the semiconductor surface of the epitaxial channel portion 11 or layer 10 if portion 11 is omitted) and over the sidewall surface of the memory opening, e.g., directly on an inner sidewall surface of the outer blocking dielectric layer 501. In this embodiment, layer 503 may be deposited by chemical vapor deposition, sputtering or atomic layer deposition, and in-situ carbon incorporation is not required. The aluminum oxide layer 503 is formed as a single contiguous material layer. In one aspect of this embodiment, layer 503 is deposited with the same composition and crystal structure in its vertical portion 591 and its horizontal portion 592.

In another aspect of this embodiment, layer 503 is deposited with different composition and/or structure in its vertical portion 591 and its horizontal portion 592 due to the difference between aluminum oxide layer deposition on the insulating surface of the stack sidewall in the opening 49 versus deposition on the single crystal silicon (11 or 10) surface. Specifically, the vertical portion 591 may have a different composition from the horizontal portion 592 by having a different aluminum to oxygen atomic ratio. For example, portion 591 may be stoichiometric while portion 592 may be non-stoichiometric, or both portions may be non-stoichiometric with different aluminum to oxygen ratios. Alternatively or in addition, the vertical portion 591 may have a different structure from the horizontal portion 592 where the vertical portion 591 has an amorphous crystal structure while the horizontal portion 592 has a polycrystalline structure. Alternatively, both portions 591, 592 may be polycrystalline, but with portion 591 having a larger average grain size than portion 592. The composition and/or crystal structure of portion 592 is selected such that it may be selectively etched compared to portion 591.

Referring to FIG. 3B, a horizontal portion 592 of the contiguous aluminum oxide layer 503 on the bottom surface of the cavity 49' can optionally be converted into a doped aluminum oxygen compound portion 593 by implanting dopants into the horizontal portion 591 of the contiguous aluminum oxide layer 503. If portion 592 has a different composition or structure than portion 591 as described above, then the doping of portion 592 may be omitted. The dopants can be selected from elements that can increase the etch rate of the doped aluminum oxygen compound portion 593 relative to aluminum oxide by changing the composition of aluminum oxide and/or by introducing structural defects into the doped aluminum oxygen compound portion 593. Thus, the doped aluminum oxygen compound portion 593 can be formed at a bottom surface of the cavity 49' and a vertical portion 591 of aluminum oxide layer 503 consisting essentially of aluminum oxide can remain least over a sidewall of the memory opening.

In one embodiment, the dopants can be implanted by an ion implantation process at an implantation angle that is substantially parallel to the sidewall of the memory opening. In one embodiment, the dopants can be implanted along a direction that is substantially perpendicular to the top surface 7 of the substrate (i.e., substantially perpendicular to a horizontal interface between the aluminum oxide layer 503 and the epitaxial channel portion 11). The vertical portion 591 of the contiguous layer of aluminum oxide that is not implanted with the dopants constitutes a remaining portion of the aluminum oxide layer 503. In one embodiment, the dopants can include at least one element selected from, or a compound of at least one element selected from, helium, neon, argon, krypton, hydrogen, carbon, nitrogen, and fluorine having a dose of at least $10^{16}$ cm$^{-2}$. The energy of the ion implantation process can be selected such that a predominant portion of the implanted dopants remain in the doped aluminum oxygen compound portion 593. The dose of the ion implantation process can be selected such that the implanted dopants have an atomic concentration in a range from 0.1% to 30% of portion 593, although lesser and greater percentages can also be employed.

Referring to FIG. 3C, an anisotropic etch can be performed to etch the doped aluminum oxygen compound portion 593 without significantly etching the vertical portion of the aluminum oxide layer 503 on the sidewall of the outer blocking dielectric spacer 501. In one embodiment, the anisotropic etch can employ a plasma of $O_2$ and optionally a mix of $O_2$ and $CF_4$. Generally, plasma of $O_2$ is effective in removing carbon based materials. Alternative fluorocarbon etchant gas and/or alternative chlorofluorocarbon etchant gas and/or alternative oxygen source may be employed in the anisotropic etch which selectively etch aluminum carbonate compared to aluminum oxide. Dopant atoms in the aluminum oxygen compound portion 593 enhance the etch rate of the aluminum oxygen compound portion 593 relative to aluminum oxide portion 591. In other words, the etch rate of the aluminum oxygen compound portion 593 is greater than the etch rate of aluminum oxide portion 591 of the aluminum oxide layer due to the presence of the dopant atoms in the aluminum oxygen compound portion 593 and/or due to the implanted dopant atoms causing disorder of the crystal structure of portion 593. For example, implanted ions such as hydrogen or noble gas ions cause portion 593 to become amorphous and thus allow portion 593 to be selectively etched compared to polycrystalline portion 591. Alternatively, implanted ions such as fluorine and carbon cause a change in composition of portion 593 which allows portion 593 to be selectively etched compared to the aluminum oxide portion 591. For example, as discussed above, carbon implantation may cause the formation of aluminum carbonate portion 593 which may be selectively etched with respect to the aluminum oxide portion. Fluorine implantation may generate a volatile aluminum trifluoride compound which sublimates during a subsequent crystallization anneal, such as an anneal at a temperature above 1238° C. The sublimation of aluminum trifluoride from portion 593 causes portion 593 to become aluminum poor compared to portion 591, and permits selective etching of portion 593 compared to portion 591 due to the difference in composition (e.g., aluminum content) between the portions. Implantation of nitrogen into portion 593 may retard the crystallization of portion 593 during the subsequent crystallization anneal. In this case, the nitrogen doped portion 593 may remain amorphous after the crystallization anneal, while portion 591 is converted from amorphous to polycrystalline aluminum oxide. The amorphous portion 593 may be selectively etched compared to the polycrystalline portion 591.

A semiconductor surface, i.e., the top surface of the epitaxial portion 11, is physically exposed from underneath the cavity 49' after the doped aluminum oxygen compound portion 593 is anisotropically etched. A suitable cleaning process can be optionally performed to remove any residual material from the top surface of the epitaxial channel portion 11. The remaining portion 591 of the aluminum oxide layer 503 constitutes an inner blocking dielectric spacer, which can be topologically homeomorphic to a torus. In one embodiment, an undercut region U can be formed underneath the inner blocking dielectric spacer 503, which can consist essentially of aluminum oxide.

Referring to FIG. 3D, the processing steps of FIG. 2I can be performed to optionally deposit the first semiconductor channel layer 601.

Referring to FIG. 3E, the processing steps of FIGS. 2J and 2K can be performed to etch horizontal portions of the first semiconductor channel layer 601, the tunneling dielectric layer 506, and the memory material layer 504, and to recess a physically exposed horizontal surface of the epitaxial channel portion 11. Subsequently, the second semiconductor channel layer 602 can be deposited by a conformal deposition method.

Referring to FIG. 3F, the processing steps of FIG. 2L can be performed to form a dielectric core 62 and the drain region 63 within each memory opening.

Figure 4:
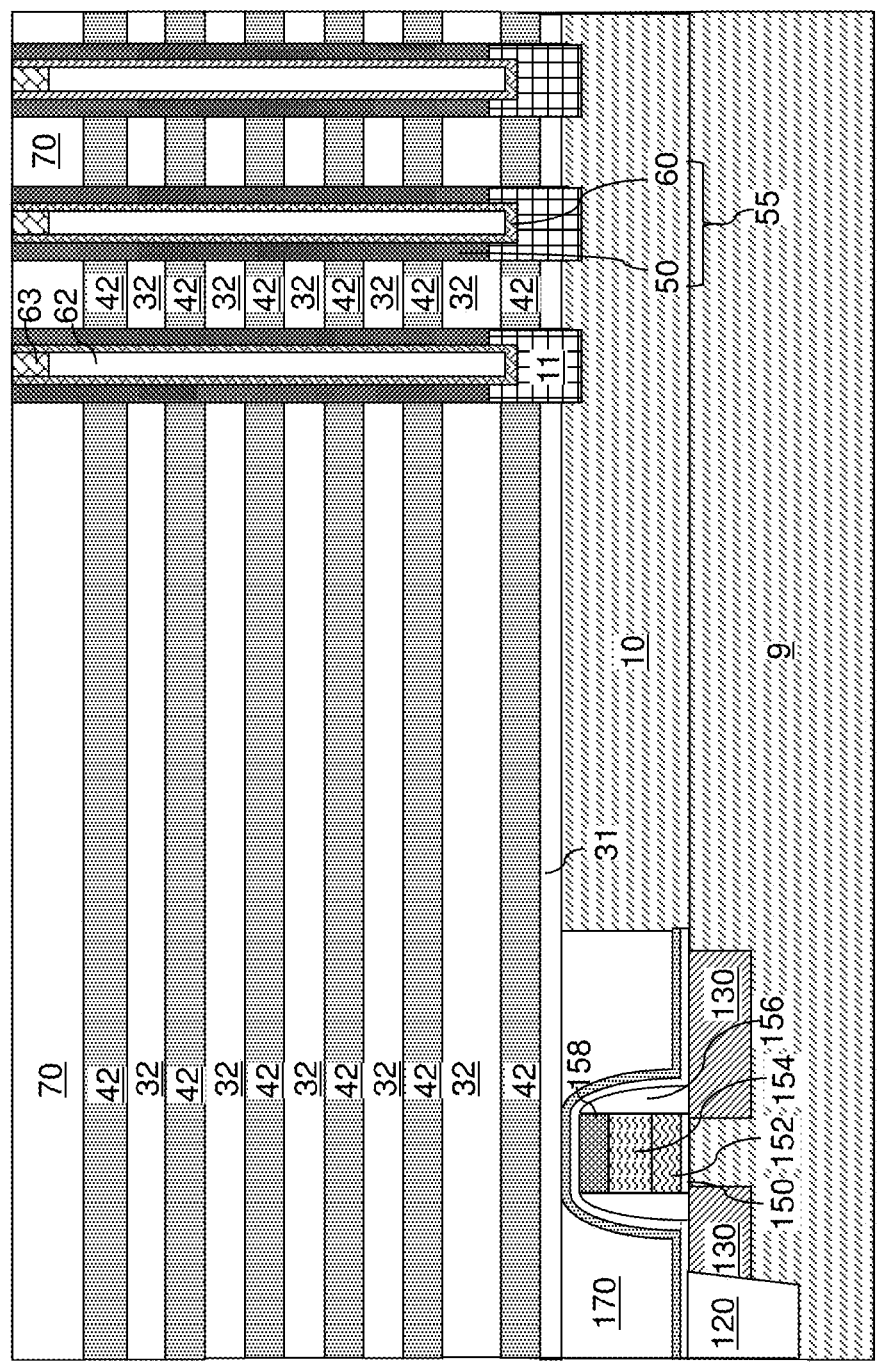
FIG. 4 is a vertical cross-sectional view of the exemplary structure after formation of memory stack structures according to an embodiment of the present disclosure.

Multiple instances of the first or second exemplary memory stack structure (or any variation thereof) can be embedded into the memory openings 49 in the exemplary structure illustrated in FIG. 1. FIG. 4 illustrates the exemplary structure that incorporates multiple instances of the exemplary memory stack structure of FIG. 2L, FIG. 2O, or FIG. 3F. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises blocking dielectric layers (501, 503) vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 5:
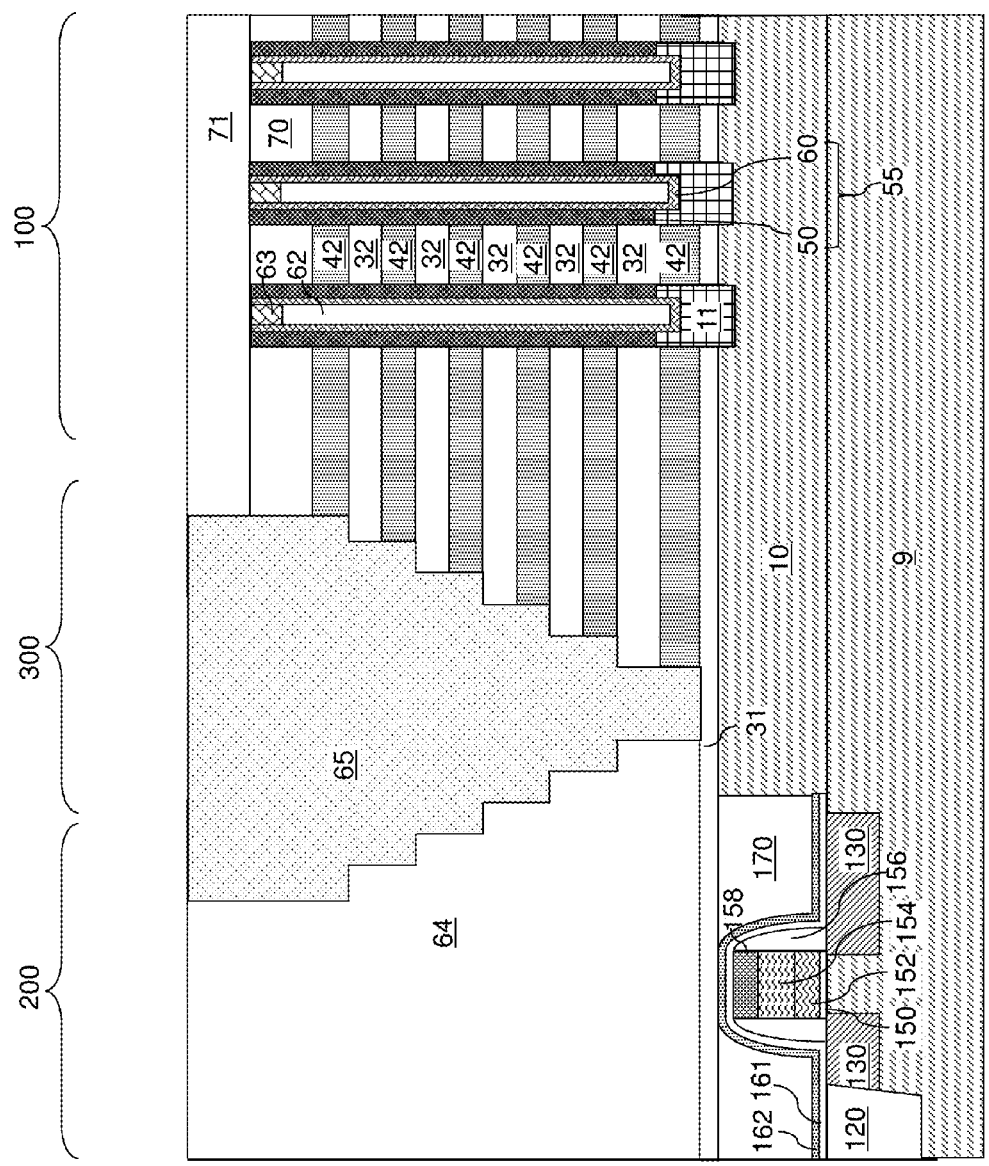
FIG. 5 is a vertical cross-sectional view of the exemplary structure after formation of a stepped terrace and a retro-stepped dielectric material portion according to an embodiment of the present disclosure.

Referring to FIG. 5, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 6A:
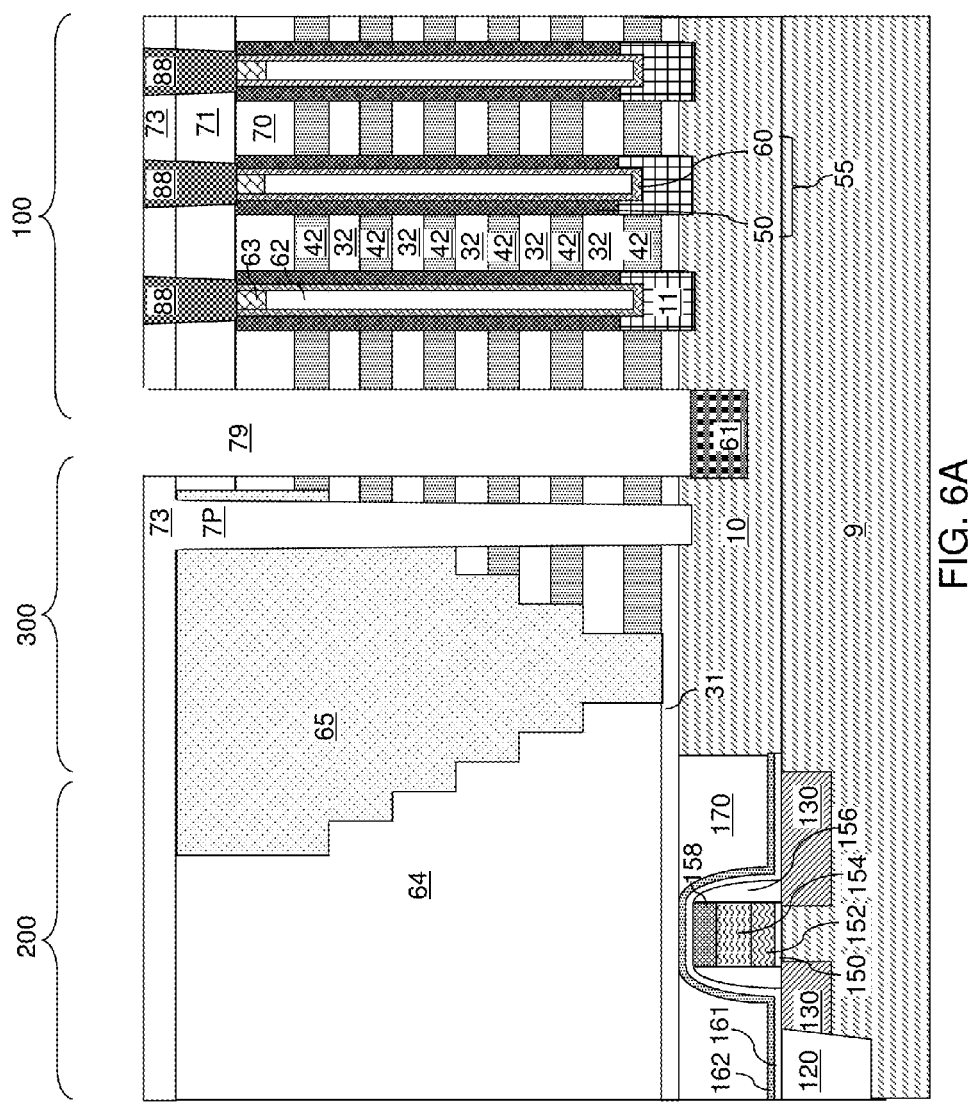
FIG. 6A is a vertical cross-sectional view of the exemplary structure after formation of a backside contact trench according to an embodiment of the present disclosure.
Figure 6B:
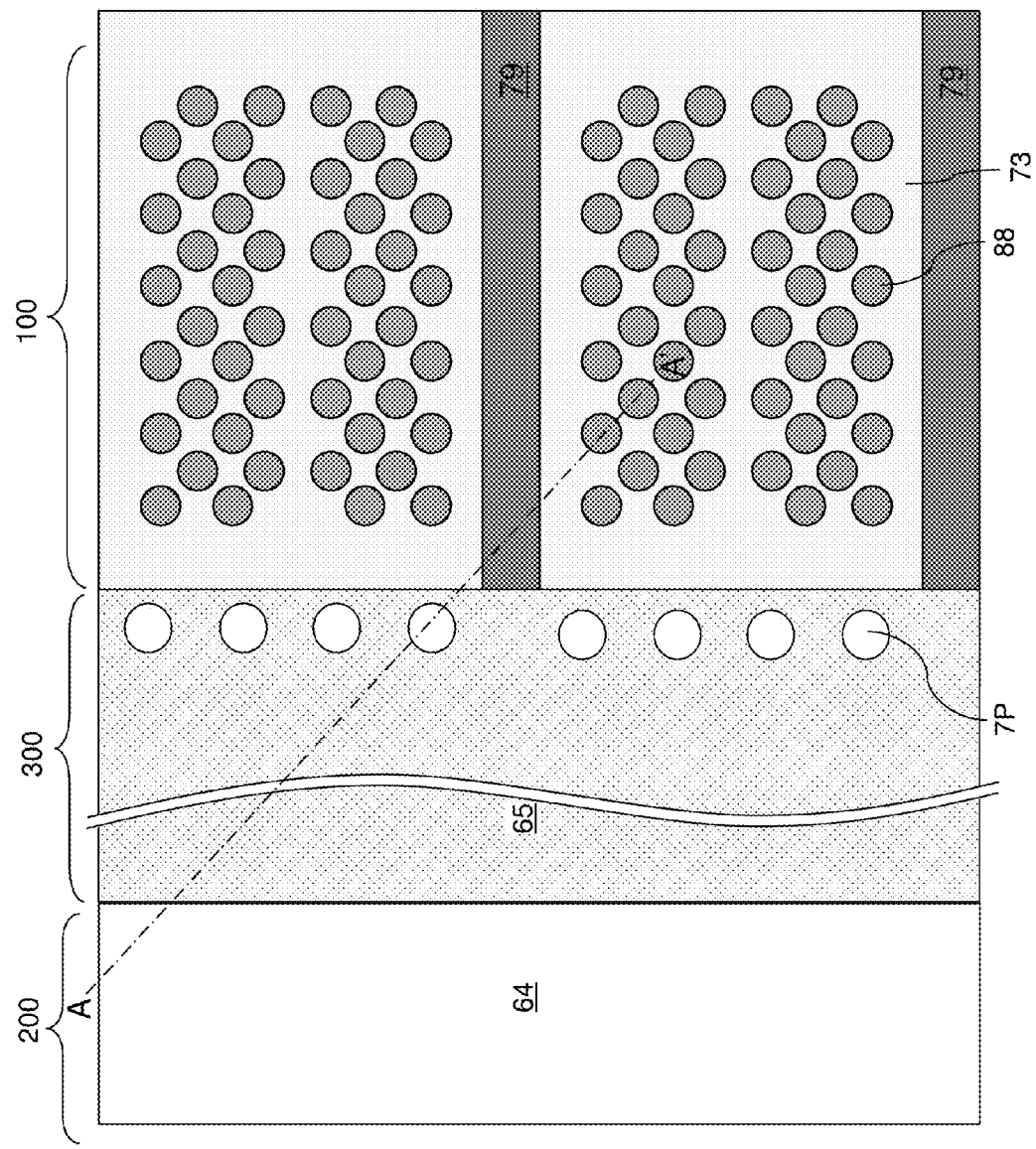
FIG. 6B is a partial see-through top-down view of the exemplary structure of FIG. 6A. The vertical plane A-A' is the plane of the vertical cross-sectional view of FIG. 6A.

Referring to FIGS. 6A and 6B, at least one dielectric support pillar 7P may be optionally formed through the retro-stepped dielectric material portion 65 and/or through the first contact level dielectric layer 71 and/or through the alternating stack (32, 42). The plane A-A' in FIG. 6B corresponds to the plane of the vertical cross-sectional view of FIG. 6A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed. Memory contact via structures 88 can be formed through the first and second contact level dielectric layers (73, 71). Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying drain region 63. The photoresist layer can be subsequently removed, for example, by ashing. Alternatively, the memory contact via structure 88 may be formed at a later step in the process shown in FIG. 10.

Another photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 7:
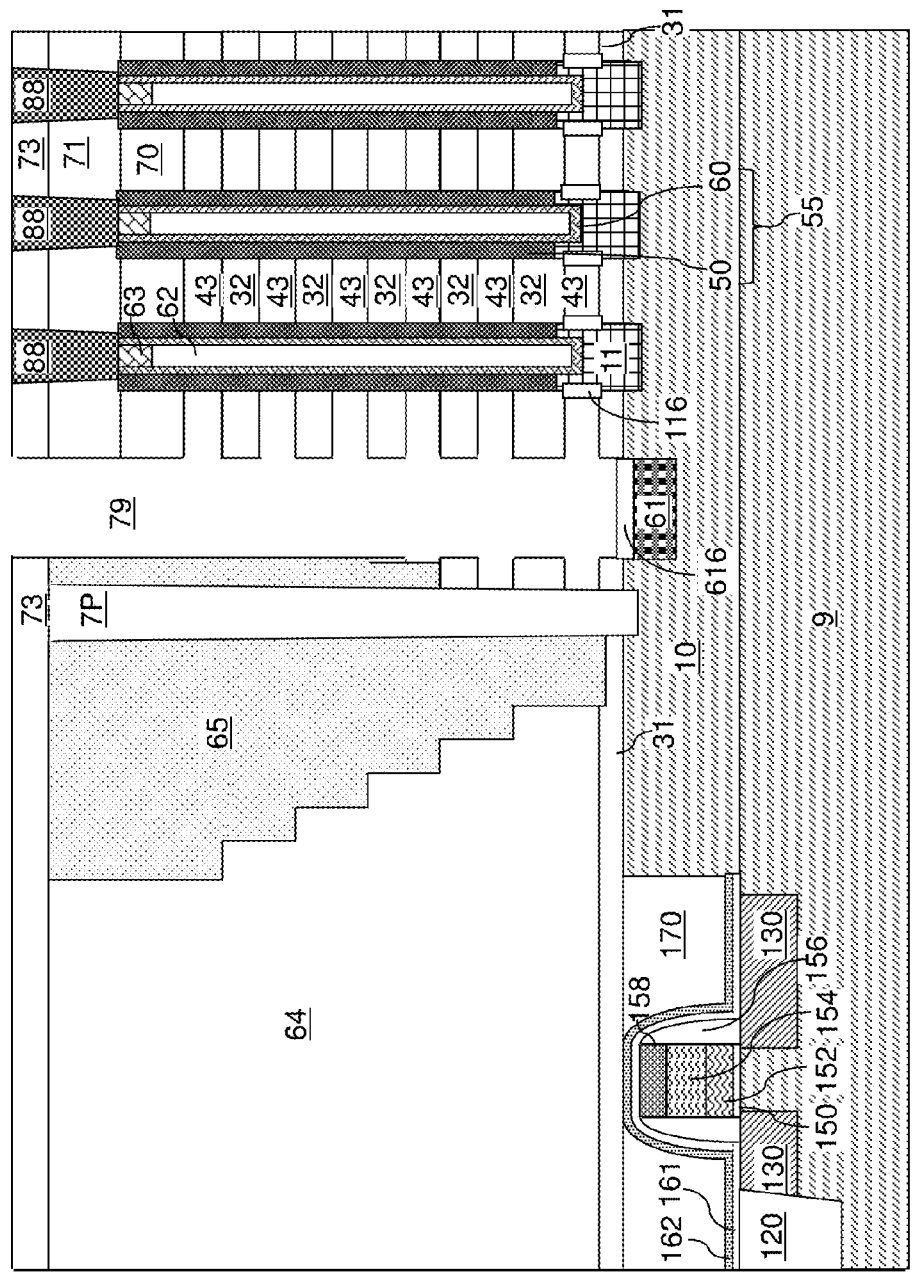
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the planar dielectric layer 31, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 8:
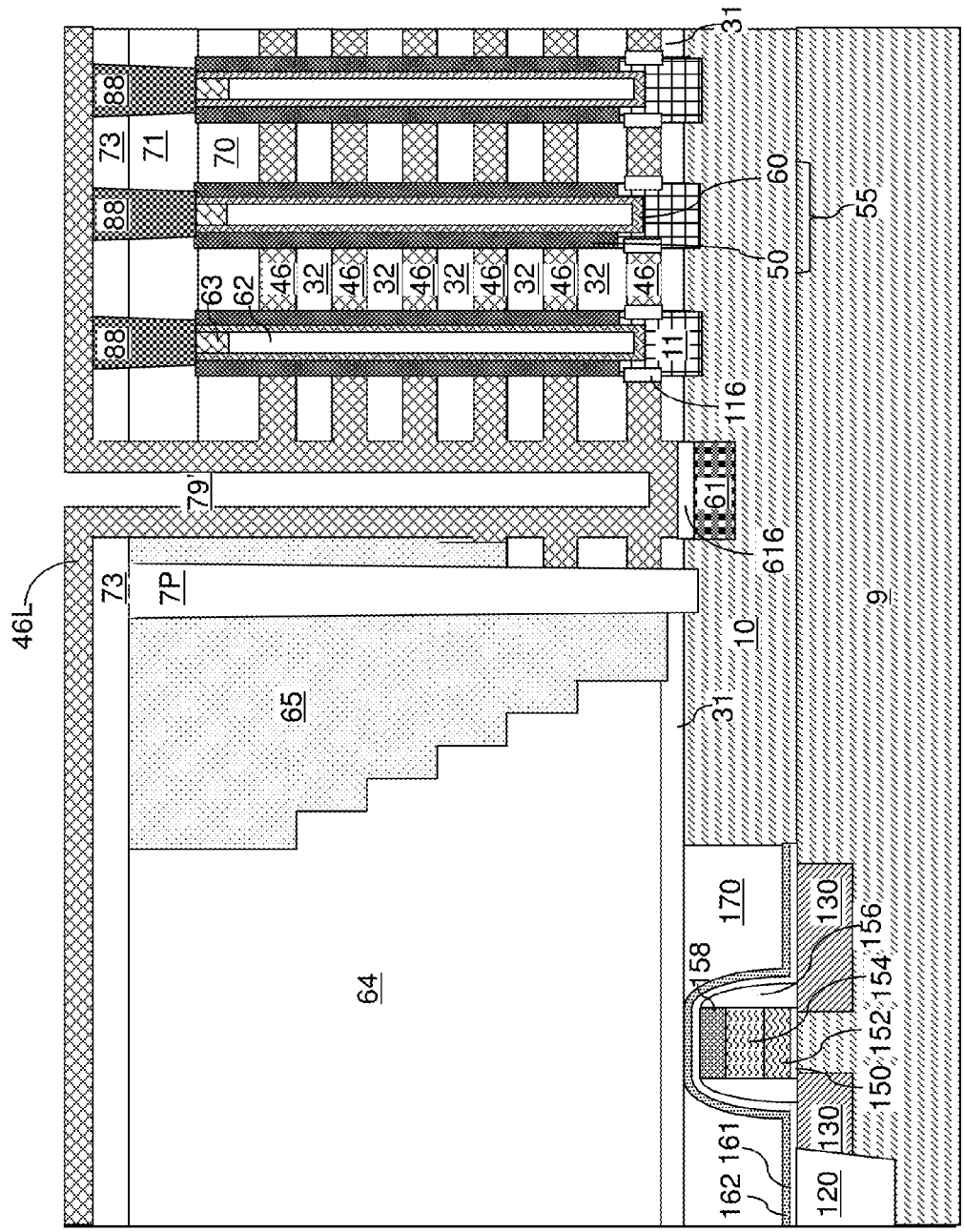
FIG. 8 is a vertical cross-sectional view of the exemplary structure after formation of electrically conductive layers according to an embodiment of the present disclosure.

Referring to FIG. 8, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric 502 is present within each memory opening, the backside blocking dielectric layer is optional. In case a blocking dielectric layer 502 is omitted, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition or atomic layer deposition.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the contiguous metallic material layer 46L.

Figure 9:
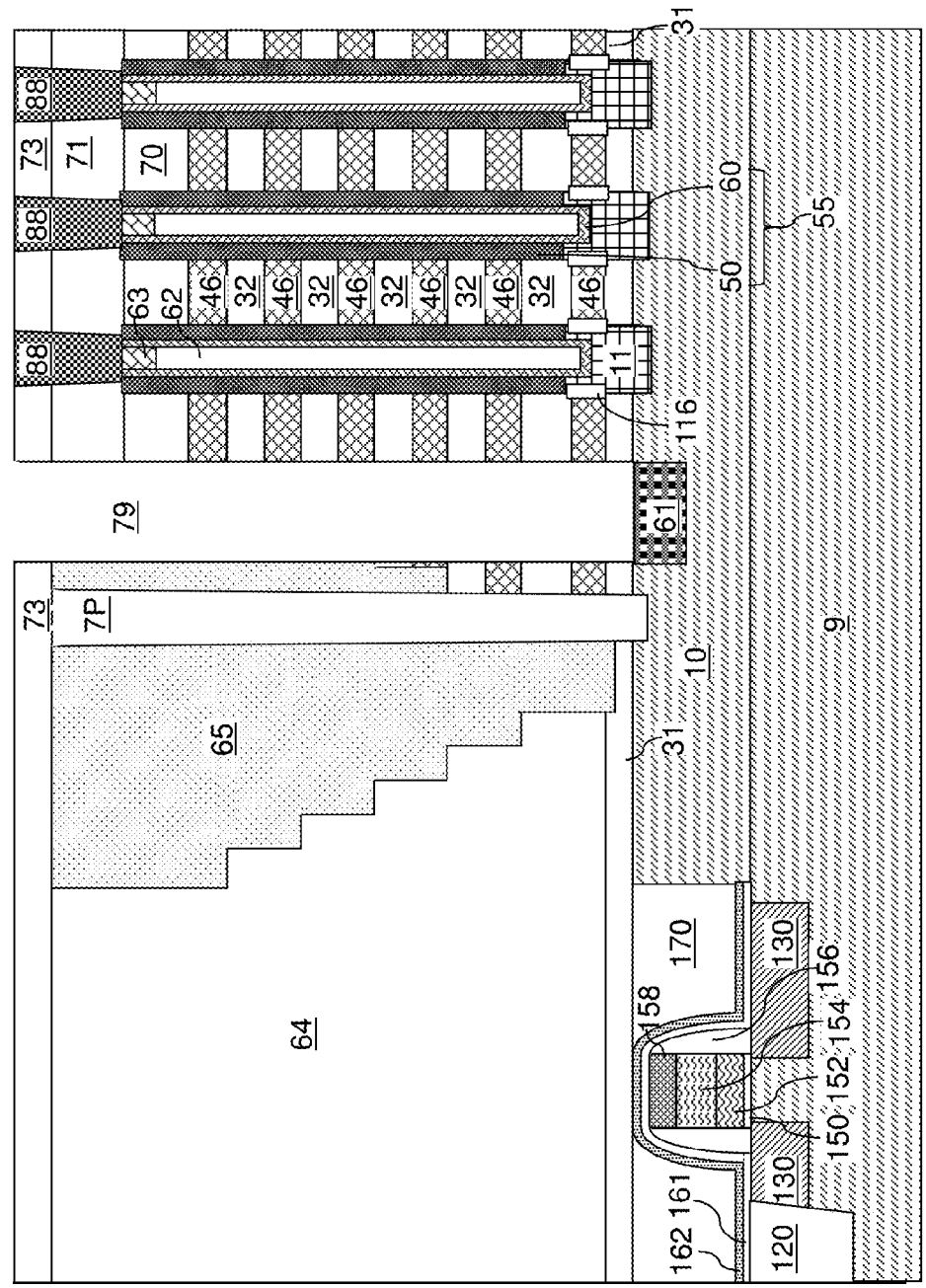
FIG. 9 is a vertical cross-sectional view of the exemplary structure after removing excess conductive material portions according to an embodiment of the present disclosure.

Referring to FIG. 9, the deposited metallic material of the contiguous metallic material layer 46L is etched back from the sidewalls of each backside contact trench 79 and from above the second contact level dielectric layer 73, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch.

In case the spacer material layers (i.e., the second material layers) are conductive material layer at the time of formation (i.e., as formed at the processing steps of FIG. 1), replacement of the spacer material layers with electrically conductive layers not necessary. In this case, the processing steps of FIGS. 7-9 can be omitted.

Figure 10:
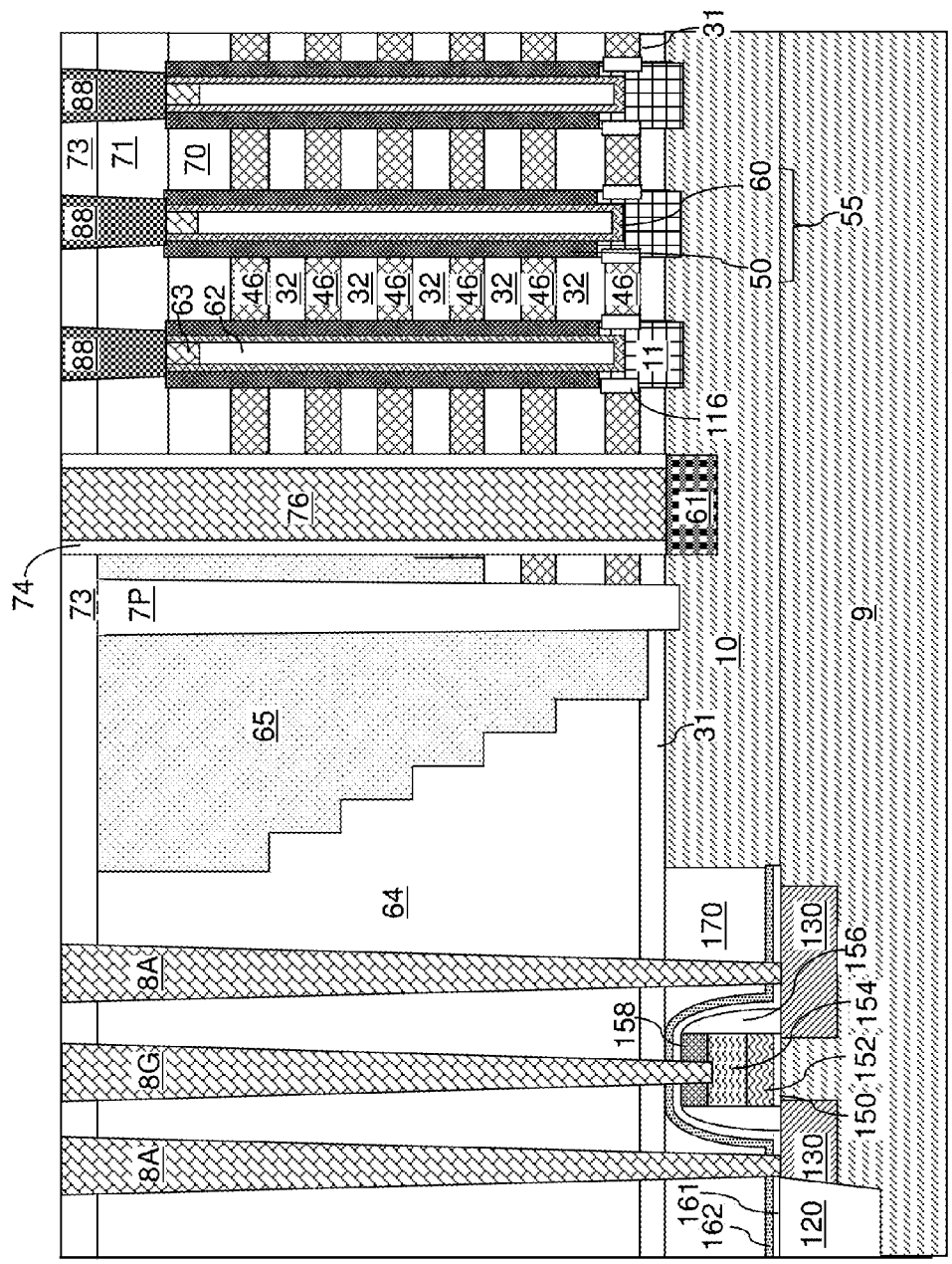
FIG. 10 is a vertical cross-sectional view of the exemplary structure after formation of various contact via structures according to an embodiment of the present disclosure.

Referring to FIG. 10, an insulating material layer 74 can be formed in the at least one backside contact trench 79 and over the second contact level dielectric layer 73 by a conformal deposition process. Exemplary conformal deposition processes include, but are not limited to, chemical vapor deposition and atomic layer deposition. The insulating material layer 74 includes an insulating material such as silicon oxide, silicon nitride, a dielectric metal oxide, an organosilicate glass, or a combination thereof. The thickness of the insulating material layer 74 can be in a range from 1.5 nm to 60 nm, although lesser and greater thicknesses can also be employed.

An anisotropic etch is performed to remove horizontal portions of the insulating material layer 74 from above the second contact level dielectric layer 73. Each remaining portion of the insulating material layer 74L inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and directly on the sidewalls of the electrically conductive layers 46, i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm.

Various contact via structures can be formed through dielectric material layers/portions of the exemplary structure. For example, peripheral device contact via structures (8G, 8A) can be formed in the peripheral device region to provide electrical contact to various nodes of the peripheral devices. The peripheral device contact via structures (8G, 8A) can include, for example, at least one gate contact via structure 8G and at least one active region contact via structure 8A. The memory contact via structures 88 may also be formed during the same step as via structures (8G, 8A). Likewise, word line contact via structures (not shown for clarity) to word lines may also be formed during the same step.

The exemplary structure includes a monolithic three-dimensional memory device. The monolithic three-dimensional memory device comprises a stack of alternating layers comprising insulating layers 32 and electrically conductive layers 46 and located over a substrate (9, 10), an array of memory openings extending through the stack, and a plurality of memory stack structures 55 located within a respective memory opening. Each electrically conductive layer 46 can laterally surround the plurality of memory stack structures 55. Each memory stack structure 55 extends through the stack of alternating layers. Each memory film 50 comprising a memory material layer 504, and a tunneling dielectric layer 506. A semiconductor channel 60 extends through the memory film 50. The tunneling dielectric layer 506 can comprise an ONO stack (as embodied as a tunneling dielectric layer 506).

In one embodiment, the memory device of the present disclosure can be a monolithic three-dimensional memory device comprising a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels. At least one end portion of each of the plurality of semiconductor channels extends substantially perpendicular to a top surface of the substrate (9, 10). In one embodiment, the plurality of semiconductor channels can comprise a common horizontal semiconductor channel layer that is a portion of the semiconductor material layer 10 between a source region 61 and the epitaxial channel portions 11, the epitaxial channel portions 11, and the vertical semiconductor channels 60 that are portions of the memory stack structures 55. The array of monolithic three-dimensional NAND strings can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The present disclosure provides various methods for eliminating, or reducing, charge scattering trap density within a semiconductor channel inside a memory stack structure. Thus, the methods of the present disclosure can be employed to enhance the on-current of three-dimensional memory devices.

Figure 11A:
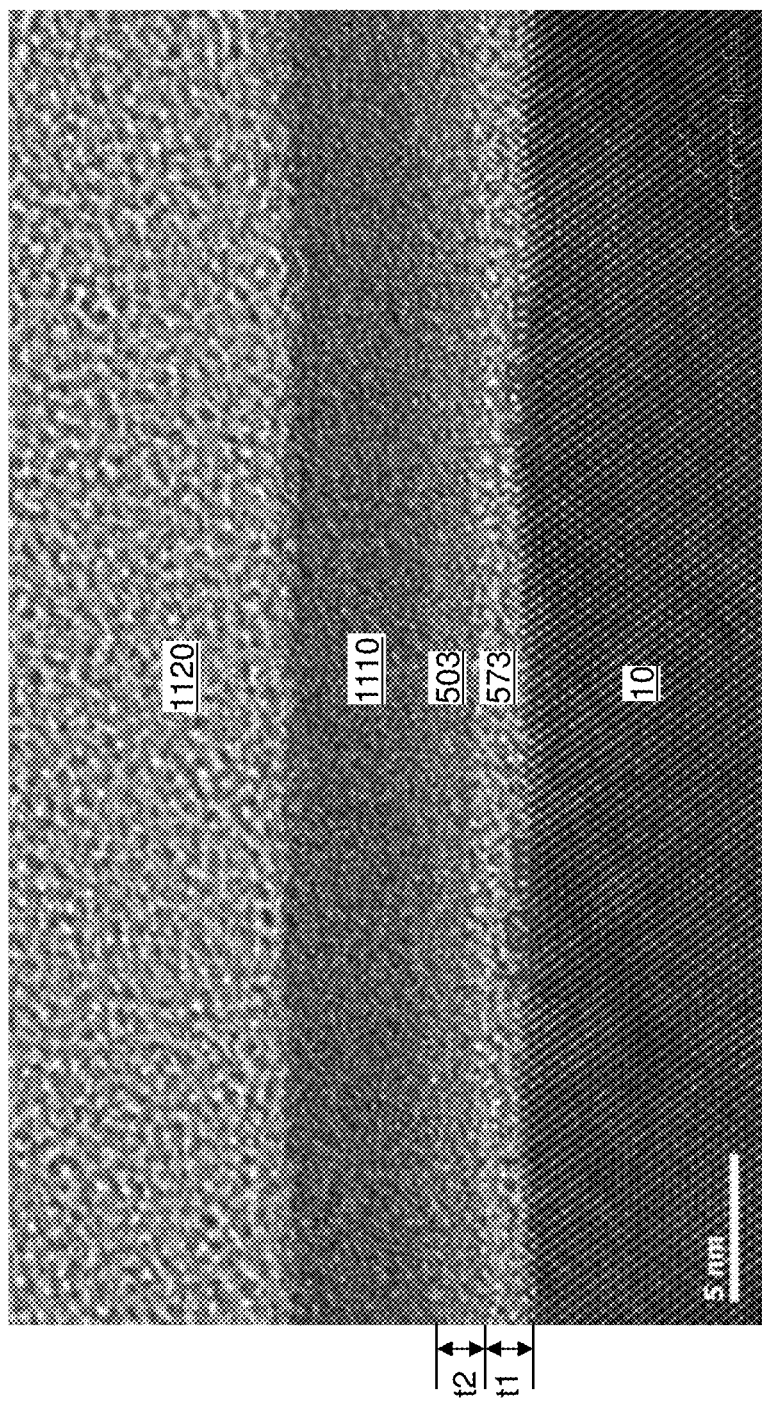
FIGS. 11A and 11B are transmission electron micrographs (TEMs) of two samples on which a stack of aluminum-carbon-oxygen alloy portion and an aluminum oxide layer was grown on a hydrogen-terminated silicon surface employing an atomic layer deposition process according to an embodiment of the present disclosure.
Figure 11B:
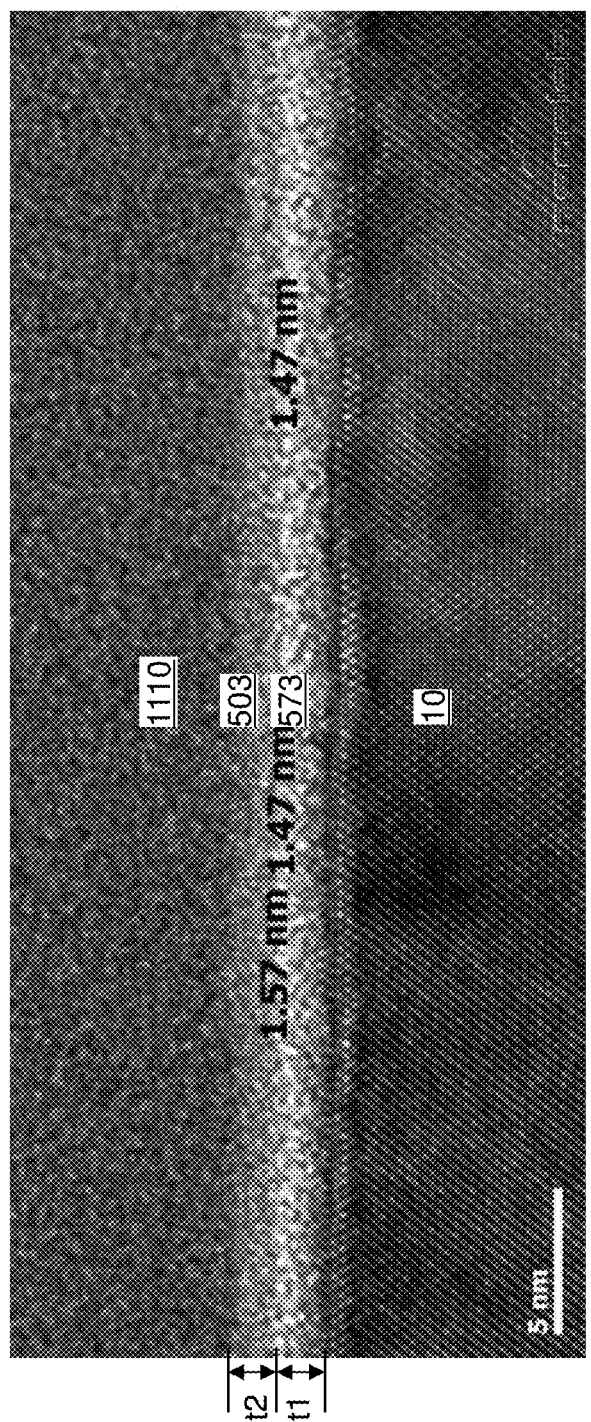

Referring to FIGS. 11A and 11B, transmission electron micrographs (TEM's) of two samples are shown. Each of the two samples includes a stack of aluminum-carbon-oxygen alloy portion 573 and an aluminum oxide layer 503 that was grown on a hydrogen-terminated silicon surface of a semiconductor material layer 10 (which is a single crystalline silicon layer) employing the atomic layer deposition process according to an embodiment of the present disclosure. The atomic layer deposition process employed trimethylaluminum and water vapor as an organic precursor and an oxidizer, respectively. The deposition temperature was about 125 degrees Celsius. The first thickness t1 of the aluminum-carbon-oxygen alloy portion 573 is about 1.5 nm, and the second thickness t2 of the aluminum oxide layer 503 is about 1.5 nm. A first cap layer 1110 (including sputter chromium) and a second cap layer 1120 (including silicon oxide) was deposited for the purpose of sample preparation.

Figure 11C:
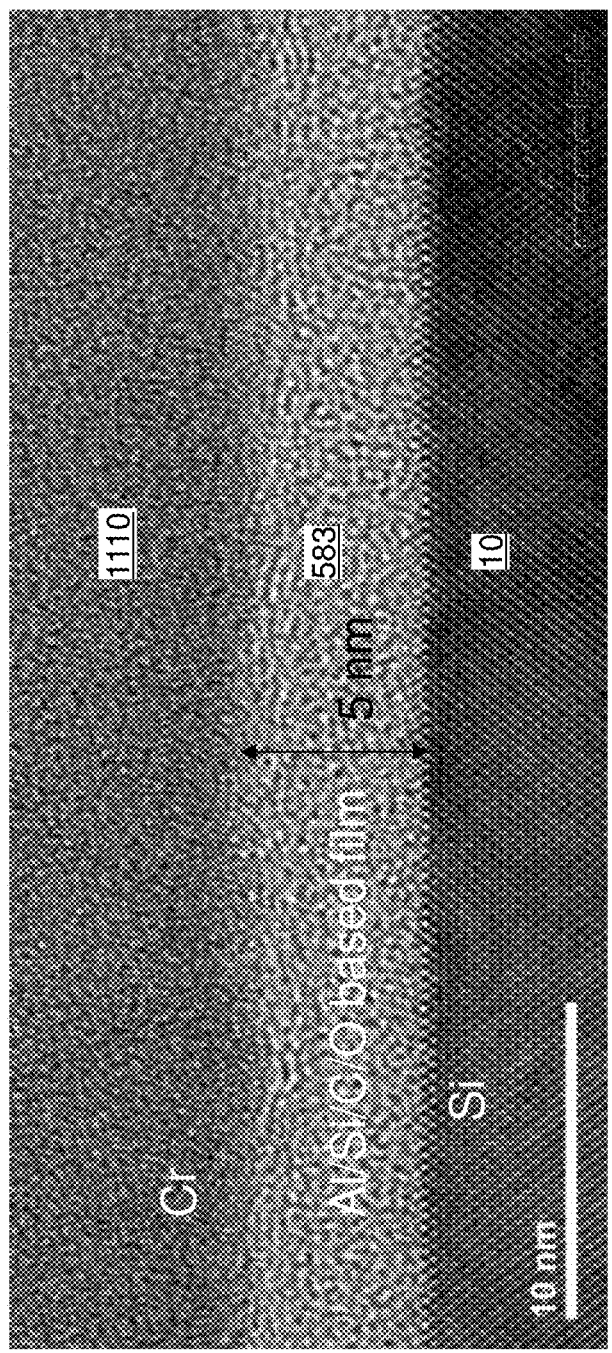
FIG. 11C is a transmission electron micrograph (TEM) of a sample that was prepared by an atomic layer deposition process to form a stack of aluminum-carbon-oxygen alloy portion and an aluminum oxide layer and was subsequently annealed at 1,000 degrees Celsius to form a carbon-doped aluminum oxygen compound portion according to an embodiment of the present disclosure.

FIG. 11C shows a transmission electron micrograph (TEM) of a sample that was prepared by the atomic layer deposition process employed to form a stack of aluminum-carbon-oxygen alloy portion and an aluminum oxide layer (in the same manner as the samples illustrated in FIGS. 11A and 11B), and was subsequently annealed at 1,000 degrees Celsius for 3 seconds by a rapid thermal anneal (RTA) process to form a carbon-doped aluminum oxygen compound portion 583 according to an embodiment of the present disclosure. The carbon-doped aluminum oxygen compound portion 583 formed by the RTA process includes aluminum, silicon, carbon, and oxygen, and has a thickness of about 5 nm, which is greater than the thickness of the stack of aluminum-carbon-oxygen alloy portion 573 and an aluminum oxide layer 503 as grown on a hydrogen-terminated silicon surface of a semiconductor material layer 10. Without wishing to be bound by a particular theory, it is believed that incorporation of silicon atoms and possibly additional oxygen atoms during the RTA process may have induced the increase of the thickness of the carbon-doped aluminum oxygen compound portion 583 over the thickness of the stack of aluminum-carbon-oxygen alloy portion 573 and an aluminum oxide layer 503 as grown on a hydrogen-terminated silicon surface of a semiconductor material layer 10.

Figure 12:
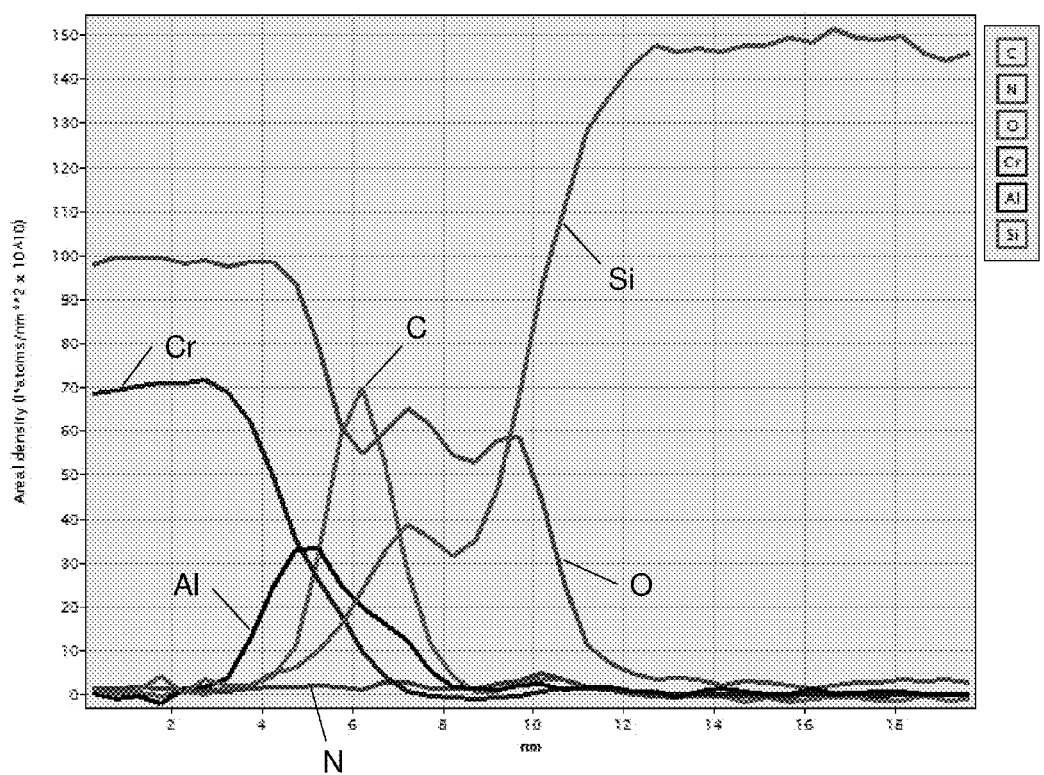
FIG. 12 is an electron energy loss spectroscopy (EELS) plot of carbon, nitrogen, oxygen, chromium, aluminum and silicon signal amplitudes (arbitrary units) versus depth in the sample (in nanometers) for the sample of FIG. 11C.

FIG. 12 illustrates an electron energy loss spectroscopy (EELS) plot of carbon, nitrogen, oxygen, chromium, aluminum and silicon signal amplitudes (arbitrary units) versus depth in the sample (in nanometers) for the sample of FIG. 11C. FIG. 12 shows that carbon atoms are present within the aluminum-carbon-oxygen alloy portion 583 formed by the atomic layer deposition process employing the organic aluminum precursor and water vapor. In FIG. 12 the carbon content (area under curve) is greater than aluminum content suggesting that the portion 583 comprises predominantly of carbon. The carbon content is highest at center of portion 583 but is not confined to a small 1 nm layer as shown in FIGS. 11A and 11B prior to the RTA crystallization anneal which is believed to be due to intermixing.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional device structure, comprising:

a stack of alternating layers comprising insulator layers and electrically conductive layers and located over a semiconductor substrate;

a memory stack structure extending through the stack of alternating layers, the memory stack structure comprising a blocking dielectric layer, a memory material layer, and a tunneling dielectric layer; and a semiconductor channel located within the memory stack structure, wherein:

the blocking dielectric layer comprises at least an aluminum oxide layer laterally surrounding, and contacting, the memory material layer; and a bottom surface of the aluminum oxide layer is vertically spaced from a semiconductor surface underneath the memory stack structure by a horizontal portion of the memory material layer.

2. The monolithic three-dimensional device structure of claim 1, wherein a bottom surface of the memory material layer is in contact with a top surface of an epitaxial channel portion that contacts the semiconductor channel.

3. The monolithic three-dimensional device structure of claim 1, wherein a bottom surface of the memory material layer is in contact with a doped semiconductor material portion including dopants, wherein the dopants comprise at least one element selected from helium, neon, argon, krypton, hydrogen, carbon, nitrogen, and fluorine.

4. The monolithic three-dimensional device structure of claim 1, wherein a bottom surface of the memory material layer is in contact with a carbon-doped semiconductor material portion.

5. The monolithic three-dimensional device structure of claim 1, wherein:

the blocking dielectric layer further comprises a silicon oxide layer contacting a sidewall of a memory opening in which the memory stack structure is located;

the memory material layer contacts a portion of an inner sidewall of the silicon oxide layer and the aluminum oxide layer contacts another portion of the inner sidewall of the silicon oxide layer; and a bottom surface of the silicon oxide layer is coplanar with a bottom surface of the memory material layer.

6. The monolithic three-dimensional device structure of claim 1, wherein:

the semiconductor substrate comprises a silicon substrate;

the three-dimensional memory device comprises an array of monolithic three-dimensional NAND strings over the silicon substrate;

at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and each NAND string comprises:

a plurality of semiconductor channels, wherein at least one end portion of each of the plurality of semiconductor channels extends substantially perpendicular to a top surface of the semiconductor substrate;

a plurality of charge storage elements, each charge storage element located adjacent to a respective one of the plurality of semiconductor channels; and a plurality of control gate electrodes having a strip shape extending substantially parallel to the top surface of the silicon substrate, the plurality of control gate electrodes comprise at least a first control gate electrode located in the first device level and a second control gate electrode located in the second device level.

* * * * *